United States Patent
Hiew et al.

(10) Patent No.: US 7,447,037 B2
(45) Date of Patent: Nov. 4, 2008

(54) SINGLE CHIP USB PACKAGES BY VARIOUS ASSEMBLY METHODS

(75) Inventors: Siew S. Hiew, San Jose, CA (US); Jim Chin-Nan Ni, San Jose, CA (US); Abraham C. Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/859,685

(22) Filed: Sep. 21, 2007

(65) Prior Publication Data

US 2008/0020641 A1 Jan. 24, 2008

Related U.S. Application Data

(60) Continuation-in-part of application No. 11/773,830, filed on Jul. 5, 2007, which is a continuation-in-part of application No. 11/624,667, filed on Jan. 18, 2007, and a continuation-in-part of application No. 11/309,847, filed on Oct. 12, 2006, which is a continuation-in-part of application No. 11/112,501, filed on Apr. 21, 2005, now Pat. No. 7,269,004, which is a division of application No. 09/478,720, filed on Jan. 6, 2000, now Pat. No. 7,257,714, which is a continuation-in-part of application No. 09/366,976, filed on Aug. 4, 1999, now Pat. No. 6,547,130.

(51) Int. Cl.
*H05K 1/14* (2006.01)

(52) U.S. Cl. ..................... 361/737; 361/715

(58) Field of Classification Search ................. 361/737, 361/727, 756, 683–687, 715, 785; 439/607, 439/374, 79, 379, 610, 680

See application file for complete search history.

(56) References Cited

U.S. PATENT DOCUMENTS

| | | | |
|---|---|---|---|
| 4,582,985 A | 4/1986 | Lofberg | |
| 4,630,201 A | 12/1986 | White | |
| 4,766,293 A | 8/1988 | Boston | |
| 4,926,480 A | 5/1990 | Chaum | |
| 5,020,105 A | 5/1991 | Rosen et al. | |
| 5,180,901 A | 1/1993 | Hiramatsu | |

(Continued)

FOREIGN PATENT DOCUMENTS

| | | |
|---|---|---|
| JP | 63-163589 A | 7/1988 |
| JP | 02-118790 A | 5/1990 |
| JP | 11-039483 | 2/1999 |

OTHER PUBLICATIONS

USB 'A' Plug Form Factor, Revision 0.9, Guideline for Embedded USB Device Applications, Nov. 29, 2004, 4 pages.
USB FlashCard "Main Body Dimensions", "Top View", "Bottom View" Web pages, Lexar, 2004, 3 pages.

*Primary Examiner*—Hung S Bui
(74) *Attorney, Agent, or Firm*—Bever, Hoffman & Harms, LLP; Patrick T. Bever

(57) ABSTRACT

A low-profile Universal-Serial-Bus (USB) assembly includes a modular USB core component and an external case. The modular USB core component includes a PCBA in which all passive components and unpackaged IC chips are attached to a single side of a PCB opposite to the metal contacts. The IC chips (e.g., USB controller, flash memory) are attached to the PCB by wire bonding or other chip-on-board (COB) technique. The passive components are attached by conventional surface mount technology (SMT) techniques. A molded housing is then formed over the IC chips and passive components such that the device has a uniform thickness. The modular USB core component is then inserted or otherwise combined with an external plastic case to provide a USB assembly. An optional carrying case is disclosed.

20 Claims, 27 Drawing Sheets

U.S. PATENT DOCUMENTS

| | | | |
|---|---|---|---|
| 5,280,527 A | 1/1994 | Gullman et al. | |
| 5,397,857 A | 3/1995 | Farquhar et al. | |
| 5,404,485 A | 4/1995 | Ban | |
| 5,414,597 A | 5/1995 | Lindland et al. | |
| 5,430,859 A | 7/1995 | Norman et al. | |
| 5,479,638 A | 12/1995 | Assar et al. | |
| 5,623,552 A | 4/1997 | Lane | |
| 5,821,614 A * | 10/1998 | Hashimoto et al. | 257/679 |
| 5,835,760 A | 11/1998 | Harmer | |
| 5,899,773 A | 5/1999 | Cheng | |
| 5,959,541 A | 9/1999 | DiMaria et al. | |
| 6,000,006 A | 12/1999 | Bruce et al. | |
| 6,012,636 A | 1/2000 | Smith | |
| 6,044,428 A | 3/2000 | Rayabhari | |
| 6,069,920 A | 5/2000 | Schultz et al. | |
| 6,069,970 A | 5/2000 | Salatino et al. | |
| 6,125,192 A | 9/2000 | Bjorn et al. | |
| 6,148,354 A | 11/2000 | Ban et al. | |
| 6,193,152 B1 | 2/2001 | Fernando et al. | |
| 6,292,863 B1 | 9/2001 | Terasaki et al. | |
| 6,297,448 B1 | 10/2001 | Hara | |
| 6,313,400 B1 | 11/2001 | Mosquera et al. | |
| 6,321,478 B1 | 11/2001 | Klebes | |
| 6,438,638 B1 | 8/2002 | Jones et al. | |
| 6,475,830 B1 | 11/2002 | Brillhart | |
| 6,554,648 B2 | 4/2003 | Shi et al. | |
| 6,567,273 B1 | 5/2003 | Liu et al. | |
| 6,615,404 B1 | 9/2003 | Garfunkel et al. | |
| 6,618,243 B1 | 9/2003 | Tirosh | |
| 6,624,005 B1 | 9/2003 | DiCaprio et al. | |
| 6,671,808 B1 | 12/2003 | Abbott et al. | |
| 6,676,420 B1 | 1/2004 | Liu et al. | |
| 6,718,407 B2 | 4/2004 | Martwick | |
| 6,733,329 B2 | 5/2004 | Yang | |
| 6,757,783 B2 | 6/2004 | Koh | |
| 6,763,410 B2 | 7/2004 | Yu | |
| 6,773,192 B1 | 8/2004 | Chao | |
| 6,778,401 B1 | 8/2004 | Yu et al. | |
| 6,832,281 B2 | 12/2004 | Jones et al. | |
| 6,854,984 B1 | 2/2005 | Lee et al. | |
| 6,900,988 B2 | 5/2005 | Yen | |
| 6,940,153 B2 | 9/2005 | Spencer et al. | |
| 6,944,028 B1 | 9/2005 | Yu et al. | |
| 7,021,971 B2 | 4/2006 | Chou et al. | |
| 7,074,052 B1 | 7/2006 | Ni et al. | |
| 7,090,541 B1 | 8/2006 | Ho | |
| 7,104,809 B1 * | 9/2006 | Huang | 439/76.1 |
| 7,296,098 B2 * | 11/2007 | Shih | 710/13 |
| 7,364,090 B2 * | 4/2008 | Cuellar et al. | 235/492 |
| 2001/0038547 A1 | 11/2001 | Jigour et al. | |
| 2001/0043174 A1 | 11/2001 | Jacobsen et al. | |
| 2002/0036922 A1 | 3/2002 | Roohparvar | |
| 2002/0116668 A1 | 8/2002 | Chhor et al. | |
| 2002/0166023 A1 | 11/2002 | Nolan et al. | |
| 2003/0038043 A1 | 2/2003 | Painsith | |
| 2003/0046510 A1 | 3/2003 | North | |
| 2003/0100203 A1 | 5/2003 | Yen | |
| 2003/0163656 A1 | 8/2003 | Ganton | |
| 2003/0177300 A1 | 9/2003 | Lee et al. | |
| 2003/0182528 A1 | 9/2003 | Ajiro | |
| 2004/0034765 A1 | 2/2004 | O'Connell | |
| 2004/0066693 A1 | 4/2004 | Osako | |
| 2004/0087213 A1 | 5/2004 | Kao | |
| 2004/0137664 A1 | 7/2004 | Elazar et al. | |
| 2004/0143716 A1 | 7/2004 | Hong | |
| 2004/0145875 A1 | 7/2004 | Yu et al. | |
| 2004/0148482 A1 | 7/2004 | Grundy et al. | |
| 2004/0153595 A1 | 8/2004 | Sukegawa et al. | |
| 2004/0255054 A1 | 12/2004 | Pua et al. | |
| 2005/0009388 A1 | 1/2005 | Chao | |
| 2005/0085133 A1 | 4/2005 | Wang et al. | |
| 2005/0114587 A1 | 5/2005 | Chou et al. | |
| 2005/0182858 A1 | 8/2005 | Lo et al. | |
| 2005/0193161 A1 | 9/2005 | Lee et al. | |
| 2005/0193162 A1 | 9/2005 | Chou et al. | |
| 2005/0216624 A1 | 9/2005 | Deng et al. | |
| 2005/0218200 A1 | 10/2005 | Focke et al. | |
| 2005/0248926 A1 | 11/2005 | Asom et al. | |
| 2006/0184709 A1 | 8/2006 | Sukegawa et al. | |
| 2008/0093720 A1 * | 4/2008 | Hiew et al. | 257/679 |
| 2008/0094807 A1 * | 4/2008 | Hiew et al. | 361/737 |

* cited by examiner

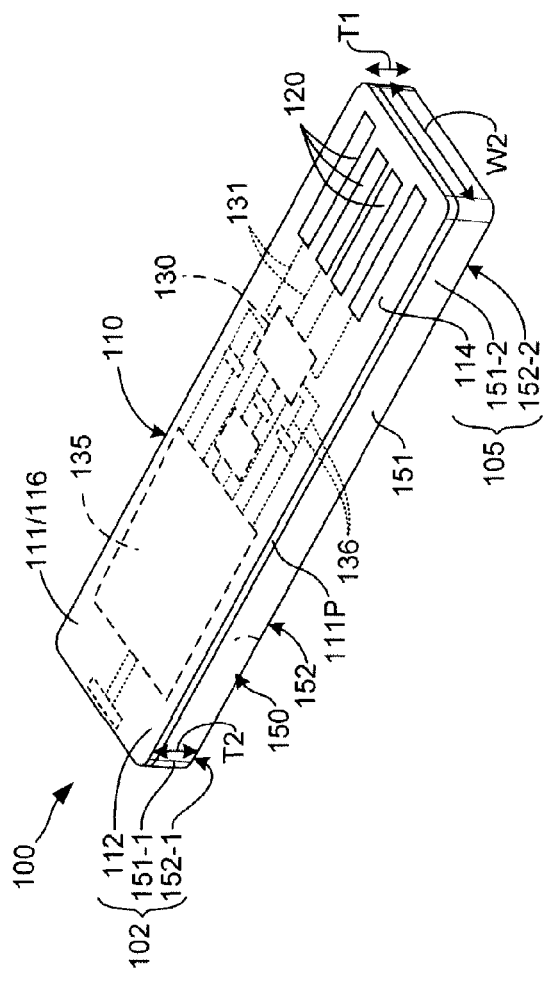
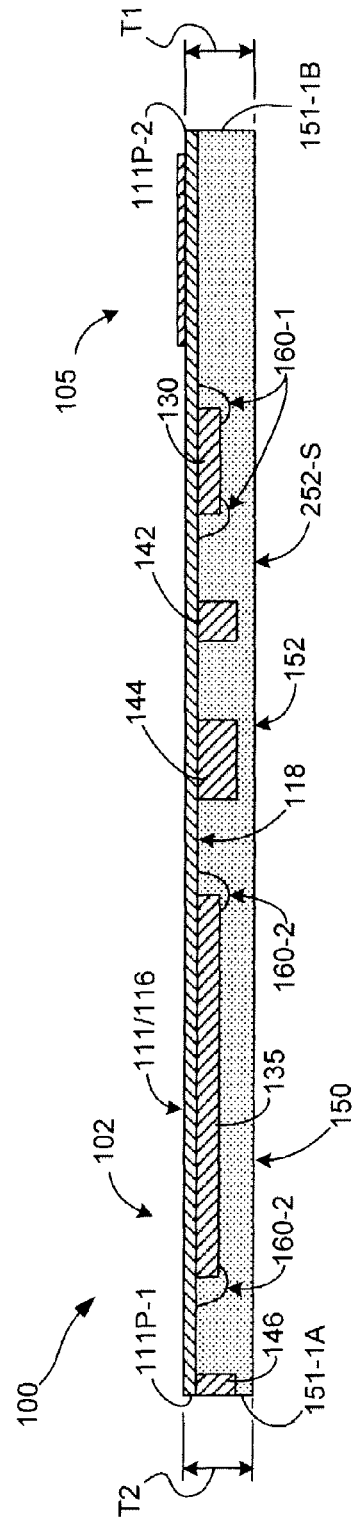
FIG. 2(A)
FIG. 2(B)

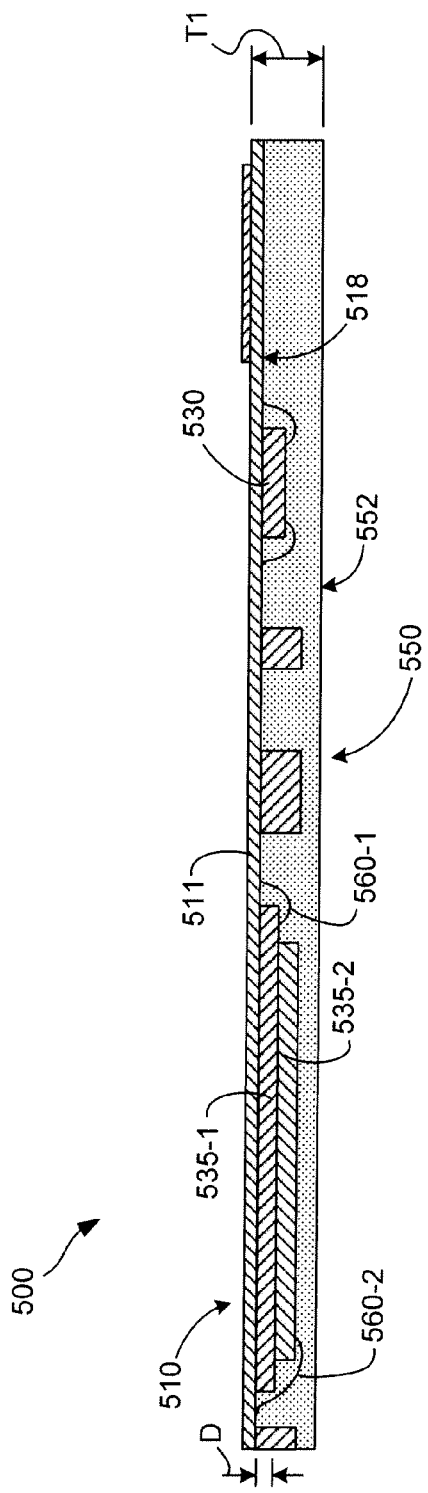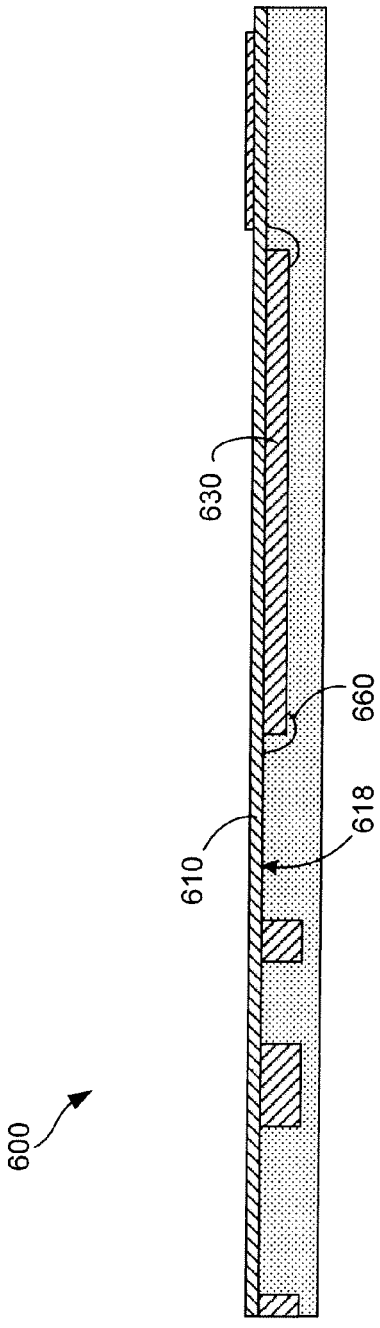

US 7,447,037 B2

SINGLE CHIP USB PACKAGES BY VARIOUS ASSEMBLY METHODS

RELATED APPLICATIONS

This application is a continuation-in-part (CIP) of U.S. Patent application for "Electronic Data Storage Medium with Fingerprint Verification Capability", U.S. application Ser. No. 11/624,667, filed Jan. 18, 2007, which is a divisional of U.S. Patent application for "Electronic Data Storage Medium with Fingerprint Verification Capability", U.S. application Ser. No. 09/478,720 filed Jan. 6, 2000, now U.S. Pat. No. 7,257,714.

This application is also a CIP of U.S. Patent application for "Molding Methods To Manufacture Single-Chip Chip-On-Board USB Device" U.S. application Ser. No. 11/773,830, filed Jul. 5, 2007, which is a CIP of U.S. Patent application for "Low-Profile USB Device", U.S. application Ser. No. 11/112,501, filed on Apr. 21, 2005.

This application is also a CIP of U.S. Patent application for "USB Device with Integrated USB Plug with USB-substrate Supporter Inside", U.S. application Ser. No. 11/309,847, filed on Oct. 12, 2006, which is a (CIP) of U.S. Patent application for "Electronic Data Storage Medium with Fingerprint Verification Capability", U.S. Ser. No. 09/478,720, filed Jan. 6, 2000.

FIELD OF THE INVENTION

This invention relates to portable electronic devices, and more particularly to portable electronic devices such as those that utilize the Universal-Serial-Bus (USB) specification.

BACKGROUND OF THE INVENTION

In the past, confidential data files were stored in floppy disks or were delivered via networks that require passwords or that use encryption coding for security. Confidential documents can be sent by adding safety seals and impressions during delivering. However, the aforesaid are exposed to the risks of breaking of the passwords, encryption codes, safety seals and impressions, thereby resulting in unsecure transfer of information.

More recently, there is an ongoing trend towards the use of miniaturized, portable computer peripheral devices to store confidential data. In certain cases, such peripheral devices have been reduced to "pocket size", meaning that they can literally be carried in a user's pocket in the same manner as a wallet or set of keys. One example of particular interest, in which context the present invention will be described herein, is a "flash disk", or "Universal Serial Bus (USB) flash drive".

The proliferation of portable computer peripheral devices, such as USB flash drives, has made the production of USB flash drives very cost sensitive. For example, there is currently a strong demand for high quality USB devices that are very low in cost. Accordingly, there is an ever increasing need for computer peripheral devices that are reliable and inexpensive to produce.

What is needed is a portable computer peripheral device that overcomes the problems associated with conventional structures. What is particularly needed is a high quality USB device that has a very low production cost.

SUMMARY OF THE INVENTION

The present invention is directed to high quality USB devices (or other electronic data storage medium) that include an external case that is mounted or otherwise formed over a modular USB core component. The modular USB component includes a card body (i.e., a printed circuit board assembly (PCBA)) and a single-piece molded housing that encases all passive components and integrated circuit (IC) components of the PCBA, which include a non-volatile memory device, a card reader interface circuit and a processing unit (e.g., a USB controller) that are implemented using one or more integrated circuit (IC) die(s) mounted on said card body. All of the components encased by the single-piece molded housing are formed on a selected surface of the card body, and standard USB metal contacts are disposed on an opposing surface that is exposed outside of the molded housing (i.e., the components are only mounted on a side of the card body that is opposite to the metal contacts). In one embodiment, the housing has a planar surface that is parallel to the PCB and extends along the entire length of the USB device (e.g., from a front edge of the plug structure to a rear edge of the handle structure), thus providing a flat (thin) structure that can be easily incorporated into a USB assembly. The modular USB component is then inserted into any of a number of different cases, thereby facilitating the production of a wide range of USB device assemblies in an inexpensive manner.

According to an aspect of the invention, passive components are mounted onto the PCB using one or more standard surface mount technology (SMT) techniques, and one or more IC die (e.g., an USB controller IC die and a flash memory die) are mounted using chip-on-board (COB) techniques. During the SMT process, the SMT-packaged passive components (e.g., capacitors, oscillators, and light emitting diodes) are mounted onto contact pads disposed on the PCB, and then known solder reflow techniques are utilized to connect leads of the passive components to the contact pads. During the subsequent COB process, the IC dies are secured onto the PCB using know die-bonding techniques, and then electrically connected to corresponding contact pads using, e.g., known wire bonding techniques. After the COB process is completed, the housing is formed over the passive components and IC dies using plastic molding techniques. By combining SMT and COB manufacturing techniques to produce modular USB core components, the present invention provides several advantages over conventional manufacturing methods that utilize SMT techniques only. First, by utilizing COB techniques to mount the USB controller and flash memory, the large PCB area typically taken up by SMT-packaged controllers and flash devices is dramatically reduced, thereby facilitating significant miniaturization of the resulting USB device footprint (i.e., providing a shorter device length and thinner device width). Second, the IC die height is greatly reduced, thereby facilitating stacked memory arrangements that greatly increase memory capacity of the USB devices without increasing the USB device footprint. Further, overall manufacturing costs are reduced by utilizing unpackaged controllers and flash devices (i.e., by eliminating the cost associated with SMT-package normally provided on the controllers and flash devices). Moreover, the molded housing provides greater moisture and water resistance and higher impact force resistance than that achieved using conventional manufacturing methods. Therefore, the combined COB and SMT method according to the present invention provides a less expensive and higher quality (i.e., more reliable) memory product with a smaller size than that possible using conventional SMT-only manufacturing methods.

According to an embodiment of the invention, a modular USB core component utilizes a single-chip controller/flash die that includes both a controller circuit and one or more flash block mass storage circuits that are interconnected by a bus. The controller circuit includes an input/output (I/O) interface circuit that facilitates sending and receiving commands and data to/from a host, and a flash-memory controller that facilitates sending and receiving sends data over the internal bus to/from the flash mass storage blocks. By combining the controller and flash memory circuits, external pins are not required, thereby further reducing the PCB area required for controller and flash memory devices, thus facilitating further miniaturization of USB devices formed in accordance with the present invention.

According to first specific embodiments of the invention, the case in which the modular USB core component is housed is a single-piece, pre-molded plastic casing that includes a relatively narrow front section and a relatively wide rear section that collectively define a cavity into which the modular USB core component is inserted. In one embodiment the front section includes a series of ribs that cover the front end of the modular USB core component and define elongated through-holes disposed such that only the metal contacts of the modular USB core component are exposed. In an alternative embodiment the front section of the case defines a large opening such that the entire front section of the modular USB core component is exposed. The rear section of the case defines an upper opening for insertion of the modular USB core component, and a cover plate is secured over the upper opening by one of a snap-coupling mechanism, a weld structure, and a thermal cure adhesive layer. In one embodiment, a UV sensitive epoxy material is used to secure the cover plate, which is made from a transparent or translucent material to facilitate the UV-cure process.

According to second specific embodiments of the invention, the case in which the modular USB core component is housed is a two-piece, pre-molded plastic casing that includes a lower case portion and an upper case portion that is mounted (e.g., snap coupled) onto the lower case portion, wherein the modular USB core component is disposed in a cavity defined by the upper case portion and the lower case portion. The upper case portion includes a plurality of ribs respectively separated by elongated openings, and the metal contacts of the modular USB core component are exposed through corresponding ones of the elongated openings.

According to third specific embodiments of the invention, the case in which the modular USB core component is housed includes a bottom piece carrier that receives the modular USB core component such that its upper surface is exposed. In one embodiment, a rear cover having a slot defined therein is mounted over a rear portion of the carrier/core component such that a front portion of the modular USB core component (i.e., the metal contacts) is exposed, and an optional front cap is mounted over the front portion to protect the metal contacts during transport. In another embodiment, a rear cover plate is mounted over a rear portion of the core component by way of an adhesive such that a front portion of the modular USB core component (i.e., the metal contacts) is exposed. In alternative embodiments, a through hole is defined through the rear cover plate and the bottom piece carrier or a circular donut structure extends from a back wall of the bottom piece carrier to facilitate connection of a key chain.

According to another embodiment, the modular USB core component is subjected to an over-molding process to form or otherwise complete the case that houses the USB core component. In one specific embodiment the modular USB core component is first mounted inside a pre-molded plastic casing such that the metal contacts of the USB core component are exposed through openings formed in the plastic casing. The partial assembly including the USB core component and the plastic casing is then inserted into the cavity of an injection molding apparatus, which injects molten plastic onto a lower surface of the modular USB core component to form an over-molded structure that secures the modular USB core component to the pre-molded plastic casing. In another specific embodiment the over-molded structure is formed directly onto the modular USB core component (i.e., no pre-molded casing is used).

In accordance with another aspect of the present invention, any of the above-described USB assemblies further includes a carrying case for securely carrying the USB assembly such that the metal contacts are protected from damage and contamination.

Thus, the present invention facilitates the production of low-cost, highly reliable, high capacity USB apparatus having aesthetic casing designs that easily and conveniently incorporate the short, modular USB core component.

BRIEF DESCRIPTION OF THE DRAWINGS

These and other features, aspects and advantages of the present invention will become better understood with regard to the following description, appended claims, and accompanying drawings, where:

FIGS. 2(A) and 2(B) are perspective top and cross sectional side views showing an exemplary modular USB device according to an embodiment of the present invention;

FIG. 18 is simplified cross-sectional side view showing a modular USB device including stacked-memory according to another embodiment of the present invention;

FIG. 19 is simplified cross-sectional side view showing a single-chip modular USB device according to another embodiment of the present invention;

DETAILED DESCRIPTION OF THE DRAWINGS

The present invention relates to an improved method for manufacturing USB devices, and in particular to USB assemblies manufactured by the method. The following description is presented to enable one of ordinary skill in the art to make and use the invention as provided in the context of a particular application and its requirements. As used herein, the terms "upper", "upwards", "lower", and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
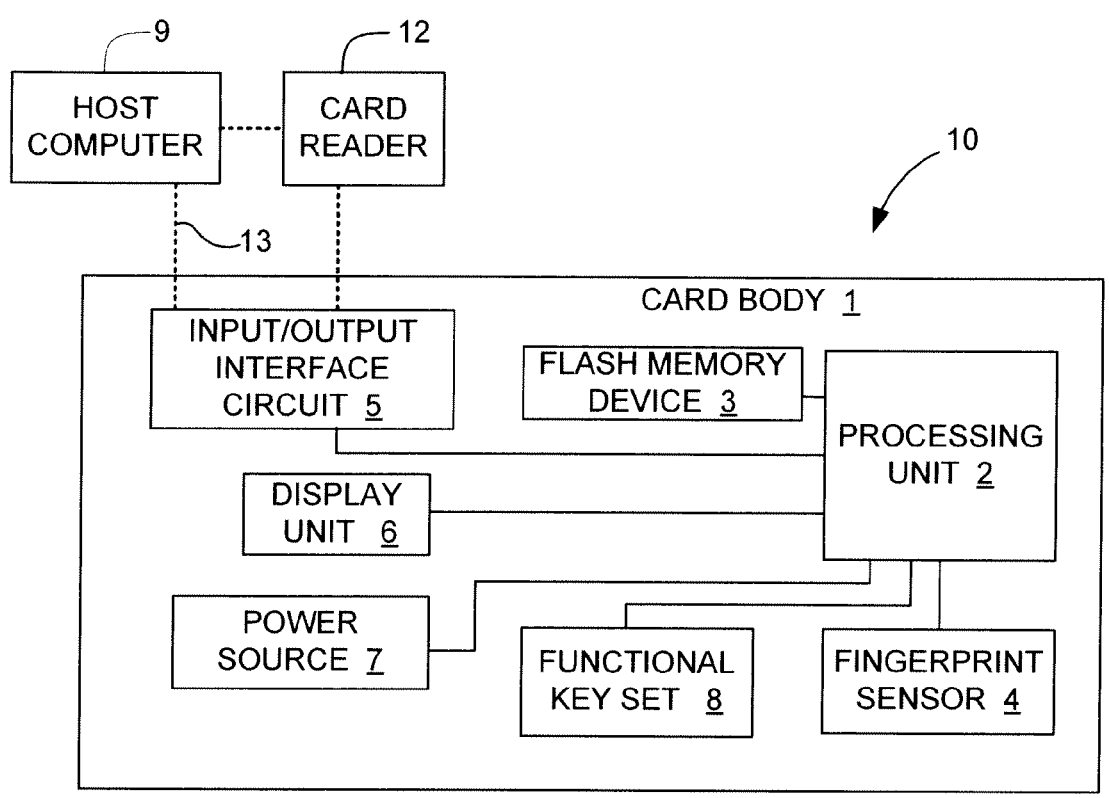
FIG. 1 is a schematic circuit block diagram illustrating an electronic data storage medium according an embodiment of the present invention.

Referring to FIG. 1, according to an embodiment of the present invention, an electronic data storage card 10 is adapted to be accessed by an external (host) computer 9 either via an optional card reader 12 or other interface mechanism, and includes a card body 1, a processing unit 2, one or more flash memory devices 3, a fingerprint sensor 4, an input/output interface circuit 5, an optional display unit 6, a power source (e.g., battery) 7, and a function key set 8.

Flash memory device 3 is mounted on the card body 1, and stores in a known manner therein a data file, a reference password, and fingerprint reference data obtained by scanning a fingerprint of a person authorized to access the data file. The data file can be a picture file or a text file.

The fingerprint sensor 4 is mounted on the card body 1, and is adapted to scan a fingerprint of a user of electronic data storage card 10 and to generate fingerprint scan data. One example of the fingerprint sensor 4 that can be used in the present invention is that disclosed in a co-owned U.S. Pat. No. 6,547,130, entitled "INTEGRATED CIRCUIT CARD WITH FINGERPRINT VERIFICATION CAPABILITY", the entire disclosure of which is incorporated herein by reference. The fingerprint sensor described in the above patent includes an array of scan cells that defines a fingerprint scanning area. The fingerprint scan data includes a plurality of scan line data obtained by scanning corresponding lines of array of scan cells. The lines of array of scan cells are scanned in a row direction as well as column direction of said array. Each of the scan cells generates a first logic signal upon detection of a ridge in the fingerprint of the holder of card body, and a second logic signal upon detection of a valley in the fingerprint of the holder of card body.

The input/output interface circuit 5 is mounted on the card body 1, and is activable so as to establish communication with the external computer 9 by way of an optional card reader 12 or via an appropriate socket. In one embodiment, input/output interface circuit 5 includes circuits and control logic associated with an Universal Serial Bus (USB), PCMCIA or RS232 interface structure that is connectable to an associated socket connected to or mounted on host computer 9. In another embodiment, input/output interface circuit 5 may include one of a Secure Digital (SD) interface circuit, a Multi-Media Card (MMC) interface circuit, a CompactFlash (CF) interface circuit, a Memory Stick (MS) interface circuit, a PCI-Express interface circuit, a Integrated Drive Electronics (IDE) interface circuit, and a Serial Advanced Technology Attachment (SATA) interface circuit, which interface with host computer 9 via optional card reader 12 according to known techniques.

The processing unit 2 is mounted on the card body 1, and is connected to the memory device 3, the fingerprint sensor 4 and the input/output interface circuit 5 by way of associated conductive traces or wires disposed on card body 1. In one embodiment, processing unit 2 is one of an 8051, 8052, 80286 microprocessor available, for example, from Intel Corporation. In other embodiments, processing unit 2 includes a RISC, ARM, MIPS or other digital signal processor. In accordance with an aspect of the present invention, processing unit 2 is controlled by a program stored at least partially in flash memory device 3 such that processing unit 2 is operable selectively in: (1) a programming mode, where the processing unit 2 activates the input/output interface circuit 5 to receive the data file and the fingerprint reference data from the host computer 9, and to store the data file and the fingerprint reference data in the memory device 3 in a compressed format to increase storage capacity of the memory device 3; (2) a data retrieving mode, where the processing unit 2 receives the fingerprint scan data from the fingerprint sensor 4, compares the fingerprint scan data with at least a segment of the fingerprint reference data in the memory device 3 to verify if the user of the electronic data storage card is authorized to access the data file stored in the memory device 3, and activates the input/output interface circuit 5 to transmit the data file to the host computer 9 upon verifying that the user of the electronic data storage card is authorized to access the data file stored in the memory device 3; and (3) a data resetting mode, where the data file and the finger reference data are erased from the memory device 3. In operation, host computer 9 sends write and read requests to electronic data flash card 10 via optional card reader 12 and input/output interface circuit 5 to the processing unit 2, which in turn utilizes a flash memory controller (not shown) to read from or write to the associated one or more flash memory device 3. In one embodiment, the processing unit 2 automatically initiates operation in the data resetting mode upon detecting that a preset time period has elapsed since storage of the data file and the fingerprint reference data in the memory device 3.

The optional power source 7 is mounted on the card body 1, and is connected to the processing unit 2 for supplying electrical power thereto.

The function key set 8, which is mounted on the card body 1, is connected to the processing unit 2, and is operable so as to initiate operation of the processing unit 2 in a selected one of the programming, data retrieving and data resetting modes. The function key set 8 is operable to provide an input password to the processing unit 2. The processing unit 2 compares the input password with the reference password in the flash memory device 3, and initiates operation in the data resetting mode upon verifying that the input password corresponds with the reference password.

The optional display unit 6 is mounted on the card body 1, and is connected to and controlled by the processing unit 2 for showing the data file exchanged with the external computer 9 and the operating status of electronic data storage card 10.

As set forth in the specific embodiments below, the present invention is directed to portable computer peripheral devices that are connected by plug connectors to host computer systems (e.g., computer 90; see FIG. 1) to perform the programming, data retrieving and data resetting functions similar to those described above. In particular, as described below with reference to the embodiments shown in FIGS. 2-35, the present invention is directed to peripheral devices in which a modular Universal-Serial-Bus (USB) core component 10 is formed that can be inserted into any of a number of different housings, thereby facilitating the production of a wide range of USB device assemblies in an inexpensive manner. At least some of the components of electronic data storage card 10 (e.g., card body (PCB) 1, processing unit 2, non-volatile memory device 3 and card reader interface circuit 5) are implemented in the embodiment described below using USB equivalent circuits.

FIGS. 2(A) and 2(B) are perspective and cross-sectional side views showing an exemplary modular USB core component 100 that is utilized in the manufacture of USB assemblies according to the present invention. USB core component 100 generally includes a printed circuit board assembly (PCBA) 110 and a plastic housing 150 that is molded onto PCBA 110. Referring to the upper portion of FIG. 1(A), PCBA 110 includes a printed circuit board (PCB) 111 including a PCB handle section 112 at a rear end of PCB 111, and a PCB plug section 114 at a front end of PCB 111. PCB 111 is a substantially flat substrate, and has opposing sides that are referred to below as upper (first) surface 116 and lower (second) surface 118. Formed on upper surface 116 in plug section 114 are four metal contacts 120. Metal contacts 120 are shaped and arranged in a pattern established by the USB specification. PCB 111 is formed in accordance with known PCB manufacturing techniques such that metal contacts 120, IC dies 130 and 135, and passive components 142, 144 and 146 are electrically interconnected by a predefined network including conductive traces 131 and 136 and other conducting structures that are sandwiched between multiple layers of an insulating material (e.g., FR4) and adhesive.

According to an aspect of the invention, passive components are mounted onto lower surface 118 using one or more standard surface mount technology (SMT) techniques, and one or more integrated circuit (IC) die (e.g., control IC die 130 and flash memory die 135) are mounted using chip-on-board (COB) techniques. As indicated in FIG. 1(B), during the SMT process, the passive components, such as capacitors 142, oscillator 144 and a light emitting diode 146, are mounted onto contact pads (described below) disposed on lower surface 118, and are then secured to the contact pads using known solder reflow techniques. To facilitate the SMT process, each of the passive components is packaged in any of the multiple known (preferably lead-free) SMT packages (e.g., ball grid array (BGA) or thin small outline package (TSOP)). In contrast, IC dies 130 and 135 are unpackaged, semiconductor "chips" that are mounted onto surface 118 and electrically connected to corresponding contact pads using known COB techniques. For example, as indicated in FIG. 1(B), control IC die 130 is electrically connected to PCB 111 by way of wire bonds 160-1 that are formed using known techniques. Similarly, flash memory IC die 135 is electrically connected to PCB 111 by way of wire bonds 160-2. Passive components 142, 144, 146, IC dies 130 and 135 and metal contacts 120 are operably interconnected by way of metal traces 131 and 136 that are formed on and in PCB 111 using known techniques, a few of which being depicted in FIG. 1(A) in a simplified manner by short dashed lines.

Housing 150 comprises molded plastic arranged such that substantially all of the plastic used to form housing 150 is located below (i.e., on one side of) PCB 111. Housing 150 includes a peripheral surface 151 extending downward (i.e., perpendicular to PCB 111), and a lower surface 152 that extends parallel to PCB 111. For discussion purposes, the portion of peripheral surface 151 surrounding handle section 112 of PCB 111 is referred to below as handle surface section 151-1, and the section of peripheral surface 151 surrounding plug section 114 of PCB 111 is referred to below as plug surface section 151-2. Similarly, the portion of lower surface 152 covering handle section 112 of PCB 111 is referred to below as handle surface section 152-1, and the section of lower surface 152 covering plug section 114 of PCB 111 is referred to below as plug cover section 152-2.

Referring again to FIG. 1(A), a handle structure 102 of USB core component 100 is defined by handle surface section 151-1, handle surface section 152-1, and the exposed upper surface 116 of PCB handle section 112. Similarly, a plug structure 105 of Modular USB core component 100 is defined by plug surface section 151-2, plug surface section 152-2, and the exposed upper surface 116 of PCB plug section 114.

Referring to FIGS. 2(A) and 2(B), a thickness T1 and width W1 of plug structure 105 is selected to produce a secure (snug) fit inside the plug portion of an external case (discussed below).

As indicated in FIG. 2(B), according to another aspect of the present invention, housing 150 includes a planar surface 152 that is parallel to PCB 111, and defines a single plane such that a first thickness T1 of plug structure 105 (i.e., measured between upper PCB surface 116 and planar surface 152 adjacent to metal contacts 120) is substantially equal to a second thickness T2 of handle section 102 (i.e., measured between upper PCB surface 116 and planar surface 152 adjacent to IC 135. That is, as indicated in FIG. 1(B), modular USB core component 100 is substantially flat along its entire length (i.e., from rear edge 151-1A to front edge 151-1B). The term "substantially flat" is meant to indicate that planar surface 152 is substantially parallel to an uppermost surface of modular USB core component 100 along its entire length. In the embodiment shown in FIGS. 1(A) and 1(B), the uppermost surface of modular USB core component 100 is defined in part by upper surface 116 of PCB 111, which is parallel to planar surface 152 along the entire length of USB core component 100. Similarly, the term "substantially flat" is also intended to cover embodiments described below in which the housing includes a thin wall structure that is formed on or otherwise contacts the upper surface of the PCB. In these embodiments, the thickness T2 of handle structure 102 may differ by a small amount (e.g., 5% from thickness T1 of plug structure 105.

According to an aspect of the present invention, the "flatness" associated with modular USB core component 100 is achieved by mounting all of the IC dies ("chips") and other electronic components of modular USB core component 100 on lower surface 118 of PCB 111 (i.e., on the side opposite to metal contacts 120). That is, the minimum overall thickness of modular USB core component 100 is determined by the thickness T1 that is required to maintain a snug connection between plug structure 105 and female USB socket connector (not shown). Because this arrangement requires that metal contacts 120 be located at the uppermost surface, and that plug wall section 151-2 plug and cover section 152-2 extend a predetermined distance below PCB 111 to provide the required thickness T1. Thus, the overall thickness of modular USB core component 100 can be minimized by mounting the IC dies 130 and 135 and passive components (e.g., capacitor 142) only on lower surface 118 of PCB 111. That is, if the IC dies and passive components are mounted on upper surface 116, then the overall thickness of the resulting USB structure would be the required thickness T1 plus the thickness that the ICs extend above PCB 111 (plus the thickness of a protective wall, if used).

According to another aspect associated with the embodiment shown in FIGS. 2(A) and 2(B), upper surface 116 of PCB 111 is entirely exposed on the upper surface of modular USB core component 100, thus facilitating the production of USB core component 100 with a maximum thickness equal to thickness T1 of plug structure 105. That is, because metal contacts 120 are formed on upper surface 116, and upper surface 116 defines the higher end of required plug structure thickness T1, the overall height of modular USB core component 100 can be minimized by exposing upper surface 116 (i.e., by making any point on upper PCB surface 116 the uppermost point of modular USB core component 100). As indicated in FIG. 2(A), in accordance with feature specifically associated with modular USB core component 100, peripheral wall 151 extends around and covers the peripheral side edges of PCB 111, and an upper edge of peripheral wall 151 is coplanar with upper surface 116 of PCB 111. By covering the peripheral side edge of PCB 111, peripheral wall 151 prevents objects from wedging between PCB 111 and housing 150, thereby preventing undesirable separation of PCBA 110 from housing 150.

Figure 3:
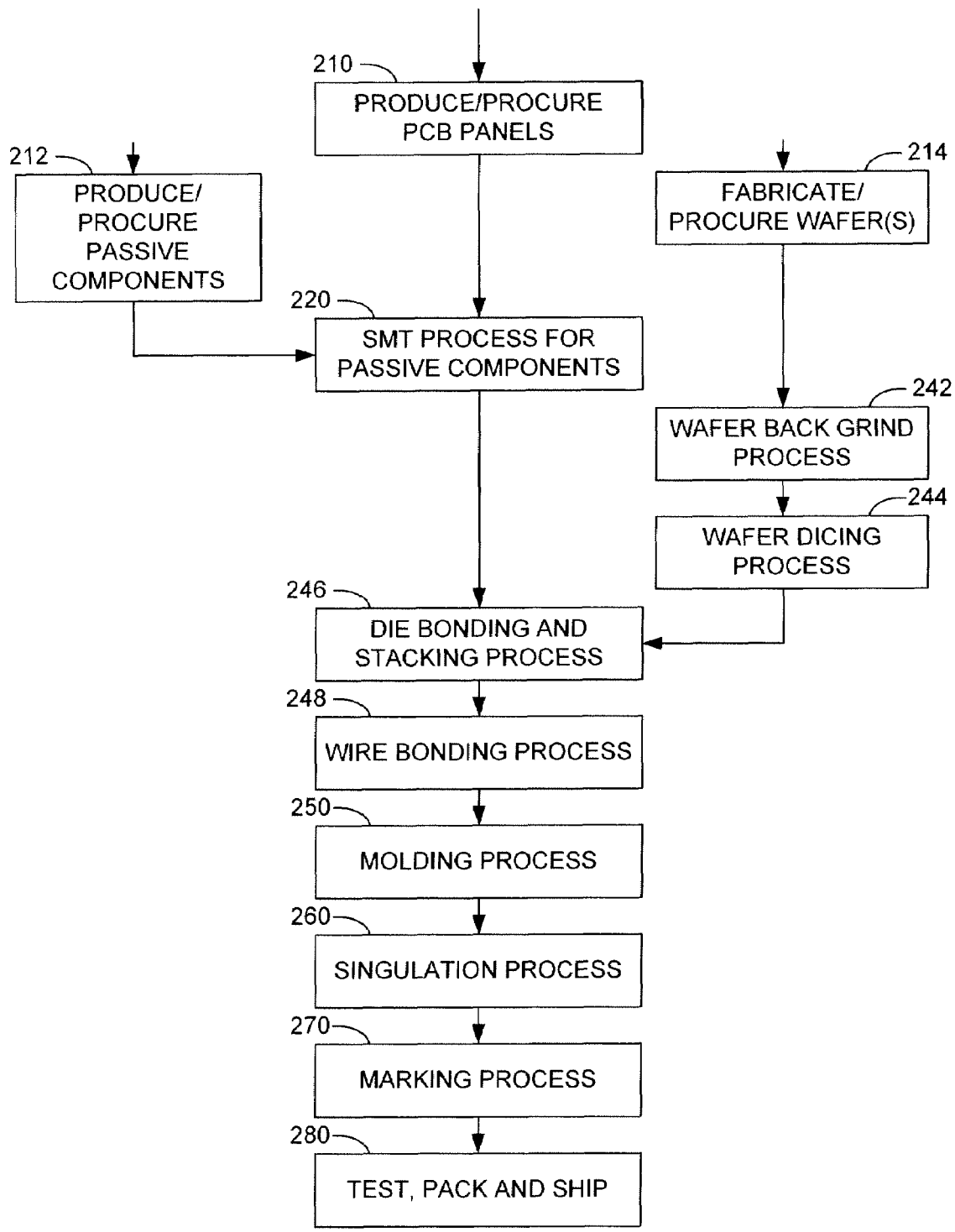
FIG. 3 is a flow diagram showing a method for producing the modular USB device of FIGS. 2(A) and 2(B) according to another embodiment of the present invention.

FIG. 3 is a flow diagram showing a method for producing modular USB core component 100 according to another embodiment of the present invention. Summarizing the novel method, a PCB panel is generated using known techniques (block 210), passive components are mounted on the PCB panel using SMT techniques (block 225), and the IC dies are die bonded (block 236) and wire bonded (block 238) using known COB techniques. Molten plastic is then used to form a molded housing over the passive components and the IC dies (block 240). Then PCB panel is then singulated (cut) in to separate USB devices (block 250), the individual USB devices are marked (block 260), and then the USB devices are tested, packed and shipped (block 270) according to customary practices. This method provides several advantages over conventional manufacturing methods that utilize SMT techniques only. First, by utilizing COB techniques to mount the USB controller and flash memory, the large amount of space typically taken up by these devices is dramatically reduced, thereby facilitating significant miniaturization of the resulting USB device footprint. Second, by implementing the wafer grinding methods described below, the die height is greatly reduced, thereby facilitating stacked memory arrangements such as those described below with reference to FIG. 18. The molded housing also provides greater moisture and water resistance and higher impact force resistance than that achieved using conventional manufacturing methods. In comparison to the standard USB memory card manufacturing that used SMT process, it is cheaper to use the combined COB and SMT (plus molding) processes described herein because, in the SMT-only manufacturing process, the bill of materials such as Flash memory and the Controller chip are also manufactured by COB process, so all the COB costs are already factored into the packaged memory chip and controller chip. Therefore, the combined COB and SMT method according to the present invention provides a less expensive and higher quality (i.e., more reliable) memory product with a smaller size than that possible using conventional SMT-only manufacturing methods.

The flow diagram of FIG. 3 will now be described in additional detail below with reference to FIGS. 4(A) to 17(B).

Referring to the upper portion of FIG. 3, the manufacturing method begins with filling a bill of materials including producing/procuring PCB panels (block 210), producing/procuring passive (discrete) components (block 212) such as resistors, capacitors, diodes, LEDs and oscillators that are packaged for SMT processing, and producing/procuring a supply of IC wafers (or individual IC dies).

Figure 4A:
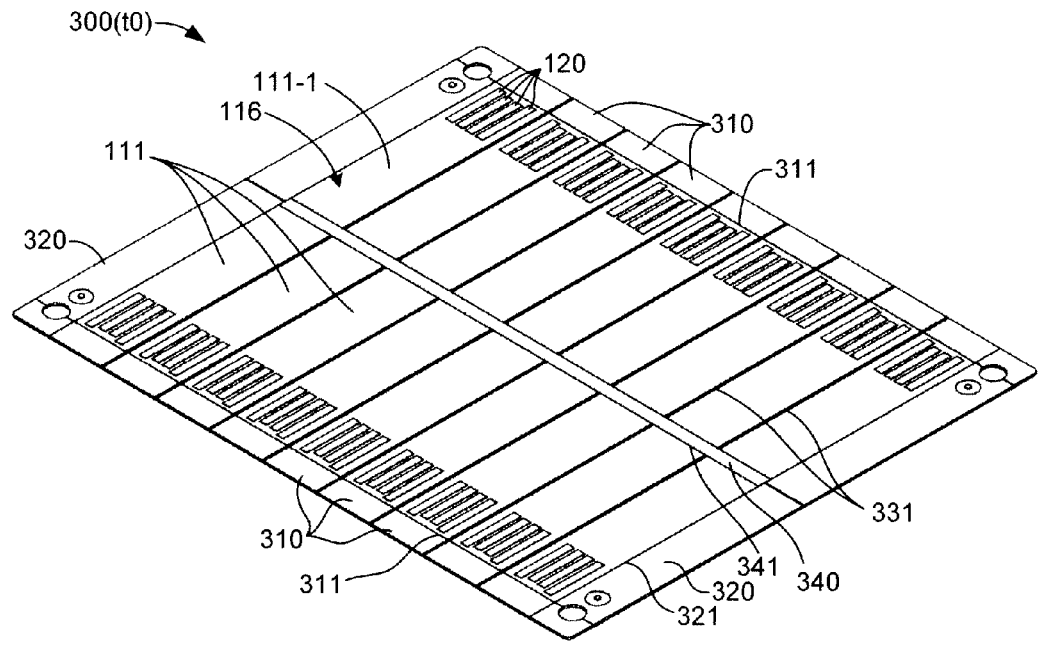
FIGS. 4(A) and 4(B) are bottom and top perspective views showing a PCB panel utilized in the method of FIG. 3.
Figure 4B:
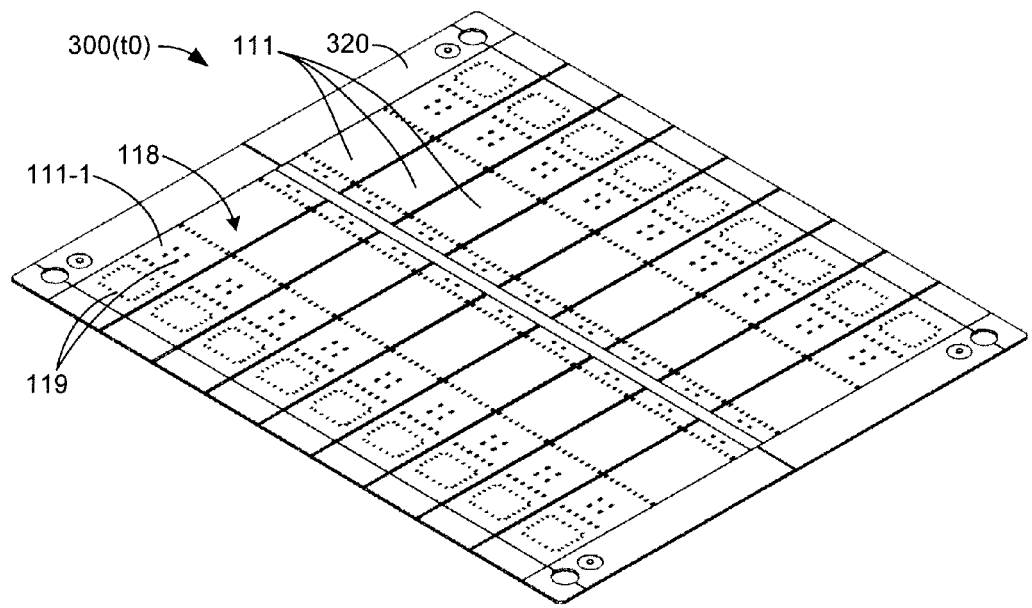

FIGS. 4(A) and 4(B) are top and bottom perspective views, respectively, showing a PCB panel 300 (t0) provided in block 210 of FIG. 3 according to a specific embodiment of the present invention. The suffix "tx" is utilized herein to designated the state of the PCB panel during the manufacturing process, with "t0" designating an initial state. Sequentially higher numbered prefixes (e.g., "t1", "t2" and "t3") indicate that PCB panel 300 has undergone additional processing.

As indicated in FIGS. 4(A) and 4(B), PCB panel 300 (t0) includes a two-by-nine matrix of regions designated as PCBs 111, each having the features described above with reference to FIGS. 1(A) and 1(B). FIG. 4(A) shows upper surface 116 of each PCB 111 (e.g., upper surface 116 of panel 111-1 includes metal contacts 120), and FIG. 4(B) shows lower surface 118 of each PCB 111. Note that lower surface 118 of each PCB 111 (e.g., PCB 111-1) includes multiple contact pads 119 arranged in predetermined patterns for facilitating SMT and COB processes, as described below.

As indicated in FIG. 4(A), in addition to the two rows of PCBs 111, panel 300 (t0) includes end border regions 310 and side border regions 320 that surround the PCBs 111, and a central region 340 disposed between the two rows of PCBs 111. Designated cut lines are scored or otherwise partially cut into PCB panel 300 (t0) along the borders of each of these regions, but do not pass through the panel material. For example, end cut lines 311 separate end border panels 310 from associated PCBs 111, side cut lines 321 separate side border panels 310 from associated PCBs 111, and central cut lines 341 separate central region 340 from associated PCBs 111. PCB cut lines 331 are formed along the side edges between adjacent PCBs 111. The border panels are provided with positioning holes and other features known to those skilled in the art to facilitate the manufacturing process, and are removed during singulation (described below).

Note that PCBs for USB devices that are produced using SMT-only manufacturing processes must be significantly wider than PCBs 111 due to the space required to mount already packaged flash memory devices. As such, PCB panels for SMT-only manufacturing methods typically include only twelve PCBs arranged in a 2×6 matrix. By utilizing COB methods to mount the flash memory, the present invention facilitates significantly narrower PCB 111, thereby allowing each PCB panel 300 (t0) to include 18 PCBs 111 arranged in a 2×9 matrix. By increasing the number of PCBs 111 per PCB panel, the present invention provides shorter manufacturing time and hence lower cost.

Figure 5:
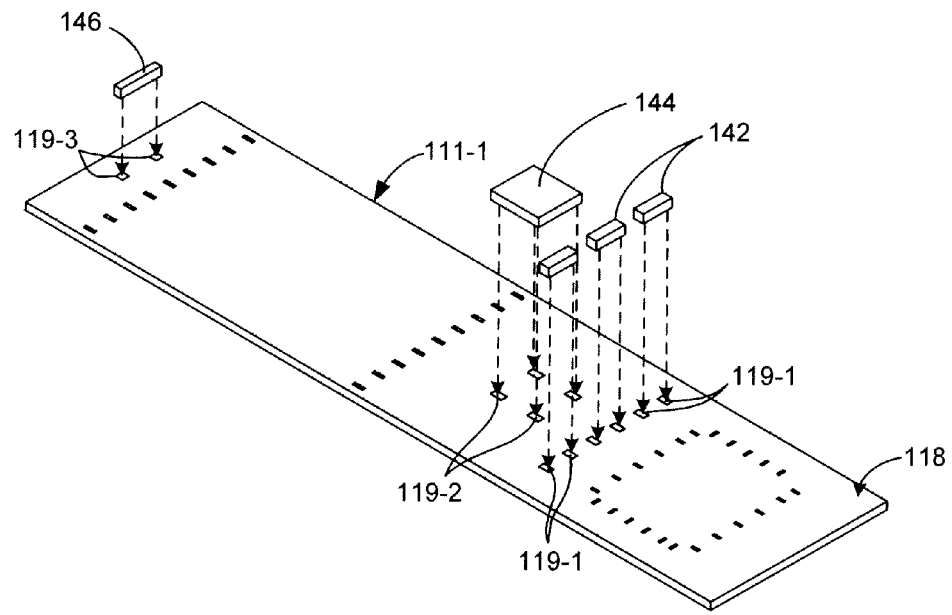
FIG. 5 is a perspective view depicting a surface mount technology (SMT) process for mounting passive components on a PCB according to the method of FIG. 3.
Figure 6:
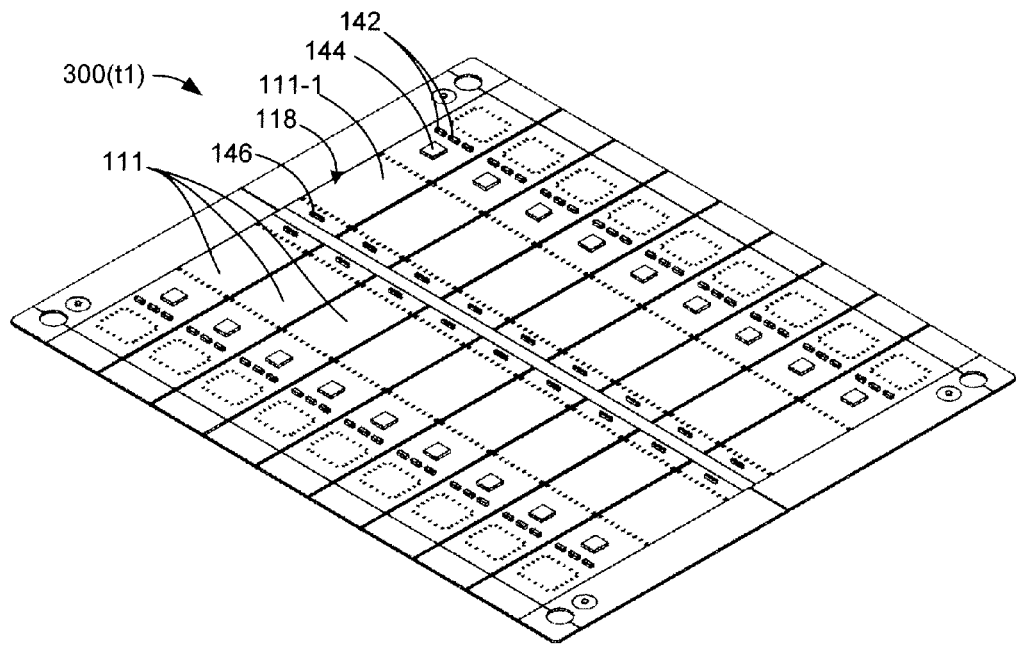
FIG. 6 is a top perspective views showing the PCB panel of FIG. 4(B) after the SMT process is completed.

FIG. 5 is a perspective view depicting a portion of a SMT process that is used to mount passive components on PCB 111-1 according to block 220 of FIG. 3. During the first stage of the SMT process, lead-free solder paste is printed on contact pads 119-1, 119-2 and 119-3, which in the present example correspond to SMT components 142, 144 and 146, using custom made stencil that is tailored to the design and layout of PCB 111-1. After dispensing the solder paste, the panel is conveyed to a conventional pick-and-place machine that mounts SMT components 142, 144 and 146 onto contact pads 119-1, 119-2 and 119-3, respectively, according to known techniques. Upon completion of the pick-and-place component mounting process, the PCB panel is then passed through an IR-reflow oven set at the correct temperature profile. The solder of each pad on the PC board is fully melted during the peak temperature zone of the oven, and this melted solder connects all pins of the passive components to the finger pads of the PC board. FIG. 6 shows the resulting sub-assembled PCB panel 300 (t1), in which each PCB 111 (e.g., PCB 111-1) includes passive components 142, 144 and 146 mounted thereon by the completed SMT process.

Figure 7:
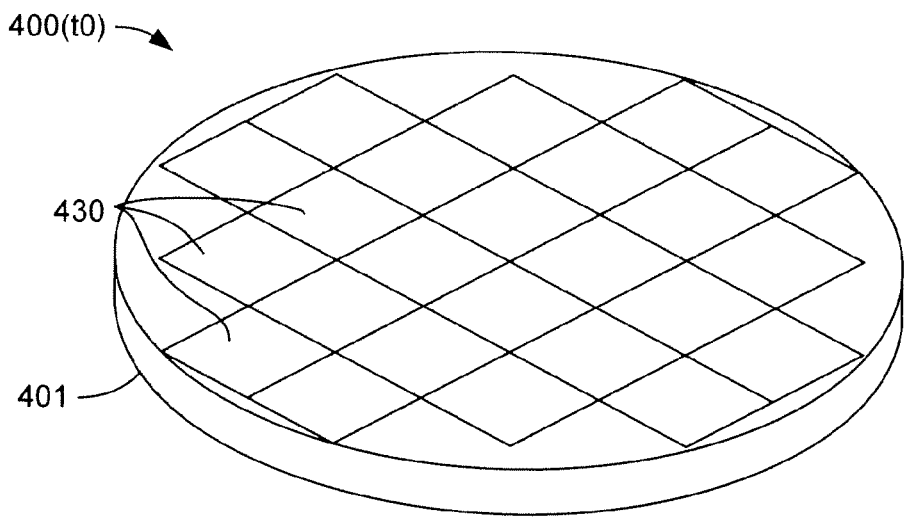
FIG. 7 is a simplified perspective view showing a semiconductor wafer including integrated circuits (ICs) utilized in the method of FIG. 3.

FIG. 7 is a simplified perspective view showing a semiconductor wafer 400 (t0) procured or fabricated according to block 214 of FIG. 3. Wafer 400 (t0) includes multiple ICs 430 that are formed in accordance with known photolithographic fabrication (e.g., CMOS) techniques on a semiconductor base 401. In the example described below, wafer 400 (t1) includes ICs 430 that comprise USB controller circuits. In a related procedure, a wafer (not shown) similar to wafer 400 (t1) is produced/procured that includes flash memory circuits, and in an alternative embodiment (described in additional detail below), ICs 430 may include both USB controller circuits and flash memory circuits. In each instance, these wafers are processed as described herein with reference to FIGS. 8(A), 8(B) and 8(C).

Figure 8A:
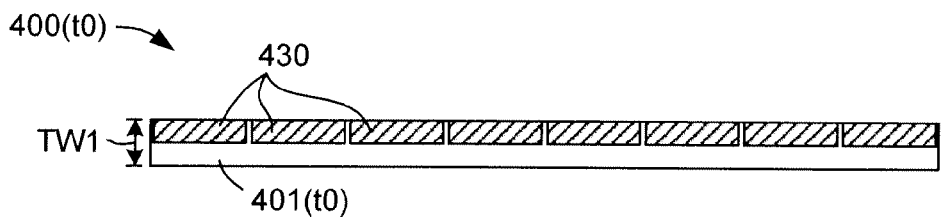
FIGS. 8(A), 8(B) and 8(C) are simplified cross-sectional side views depicting a process of grinding and dicing the wafer of FIG. 7 to produce IC dies.
Figure 8B:
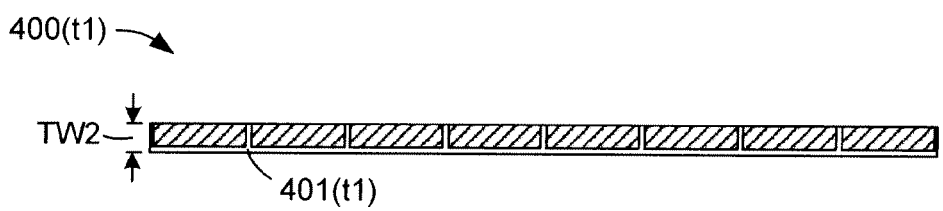

As indicated in FIGS. 8(A) and 8(B), during a wafer back grind process according to block 242 of FIG. 3, base 401 is subjected to a grinding process in order to reduce the overall initial thickness TW1 of each IC 430. Wafer 400 (t1) is first mount face down on sticky tape (i.e., such that base layer 401 (t0) faces away from the tape), which is pre-taped on a metal or plastic ring frame (not shown). The ring-frame/wafer assembly is then loaded onto a vacuum chuck (not shown) having a very level, flat surface, and has diameter larger than that of wafer 400 (t0). The base layer is then subjected to grinding until, as indicated in FIG. 8(B), wafer 400 (t1) has a preprogrammed thickness TW2 that is less than initial thickness TW1 (shown in FIG. 8(A)). The wafer is cleaned using de-ionized (DI) water during the process, and wafer 400 (t1) is subjected to a flush clean with more DI water at the end of mechanical grinding process, followed by spinning at high speed to air dry wafer 400 (t1).

Figure 8C:
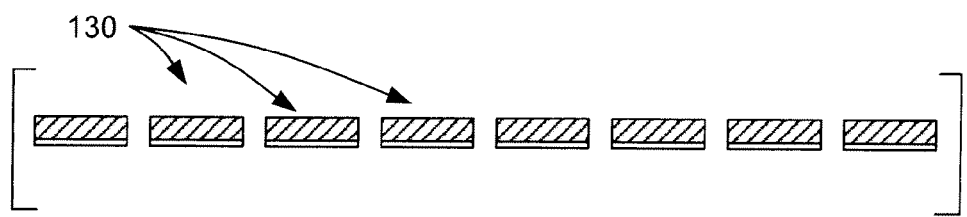

Next, as shown in FIG. 8(C), the wafer is diced (cut apart) along predefined border regions separating ICs 420 in order to produce IC dies 130 according to block 244 of FIG. 3. After the back grind process has completed, the sticky tape at the front side of wafer 400 (t1) is removed, and wafer 400 (t1) is mounted onto another ring frame having sticky tape provided thereon, this time with the backside of the newly grinded wafer contacting the tape. The ring framed wafers are then loaded into a die saw machine. The die saw machine is pre-programmed with the correct die size information, X-axis and Y-axis scribe lanes' width, wafer thickness and intended over cut depth. A proper saw blade width is then selected based on the widths of the XY scribe lanes. The cutting process begins dicing the first lane of the X-axis of the wafer. De-ionized wafer is flushing at the proper angle and pressure around the blade and wafer contact point to wash and sweep away the silicon saw dust while the saw is spinning and moving along the scribe lane. The sawing process will index to the second lane according to the die size and scribe width distance. After all the X-axis lanes have been completed sawing, the wafer chuck with rotate 90 degree to align the Y-axis scribe lanes to be cut. The cutting motion repeated until all the scribe lanes on the Y-axis have been completed.

Figure 9:
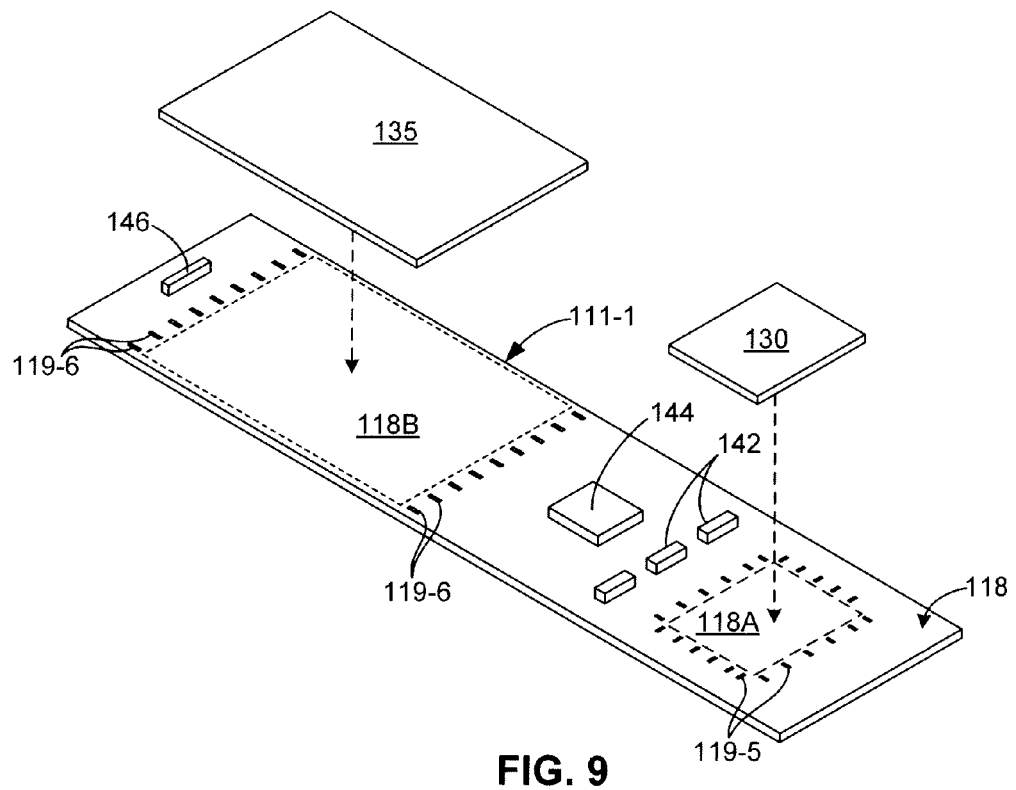
FIG. 9 is a perspective view depicting a die bonding process utilized to mount the IC dies of FIG. 8(C) on a PCB according to the method of FIG. 3.
Figure 10:
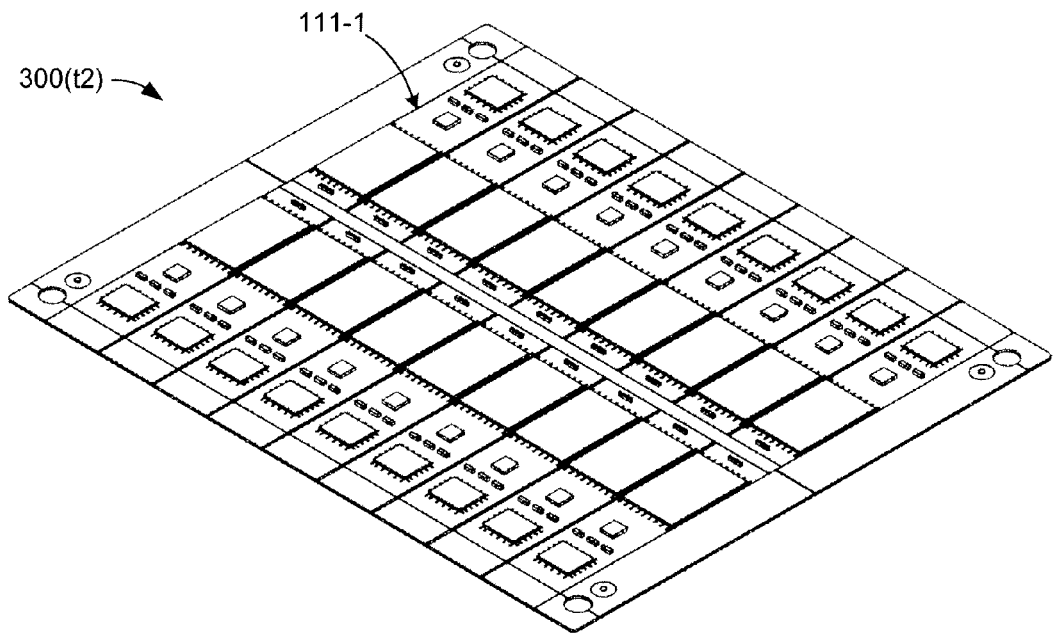
FIG. 10 is a top perspective views showing the PCB panel of FIG. 4(B) after the die bonding process is completed.

FIG. 9 is a perspective view depicting a die bonding process utilized to mount the controller IC dies 130 of FIG. 8(C) and flash memory IC dies 135 on PCB 111-1 of the PCB panel according to block 246 of FIG. 3. The die bonding process is performed on PCB panel 300 (t1) (see FIG. 6), that is, after completion of the SMT process. The die bonding process generally involves mounting controller IC dies 130 into lower surface region 118A, which is surrounded by contact pads 119-5, and mounting flash IC dies 135 into lower surface region 118B, which is disposed between rows of contact pads 119-6. In one specific embodiment, an operator loads IC dies 130 and 135 onto a die bonder machine according to known techniques. The operator also loads multiple PCB panels 300 (t1) onto the magazine rack of the die bonder machine. The die bonder machine picks the first PCB panel 300 (t1) from the bottom stack of the magazine and transports the selected PCB panel from the conveyor track to the die bond (DB) epoxy dispensing target area. The magazine lowers a notch automatically to get ready for the machine to pick up the second piece (the new bottom piece) in the next cycle of die bond operation. At the die bond epoxy dispensing target area, the machine automatically dispenses DB epoxy, using pre-programmed write pattern and speed with the correct nozzle size, onto the target areas 118A and 118B of each of the PCB 111 of PCB panel 300 (t1). When all PCBs 111 have completed this epoxy dispensing process, the PCB panel is conveyed to a die bond (DB) target area. Meanwhile, at the input stage, the magazine is loading a second PCB panel to this vacant DB epoxy dispensing target area. At the die bond target area, the pick up arm mechanism and collet (suction head with rectangular ring at the perimeter so that vacuum from the center can create a suction force) picks up an IC die 130 and bonds it onto area 118A, where epoxy has already dispensed for the bonding purpose, and this process is then performed to place IC die 135 into region 118B. Once all the PCB boards 111 on the PCB panel have completed die bonding process, the PCB panel is then conveyed to a snap cure region, where the PCB panel passes through a chamber having a heating element that radiates heat having a temperature that is suitable to thermally cure the epoxy. After curing, the PCB panel is conveyed into the empty slot of the magazine waiting at the output rack of the die bonding machine. The magazine moves up one slot after receiving a new panel to get ready for accepting the next panel in the second cycle of process. The die bonding machine will repeat these steps until all of the PCB panels in the input magazine are processed. This process step may repeat again for the same panel for stack die products that may require to stacks more than one layer of memory die. FIG. 10 is a top perspective views showing PCB panel 300 (t2) after the die bonding process is completed.

Figure 11:
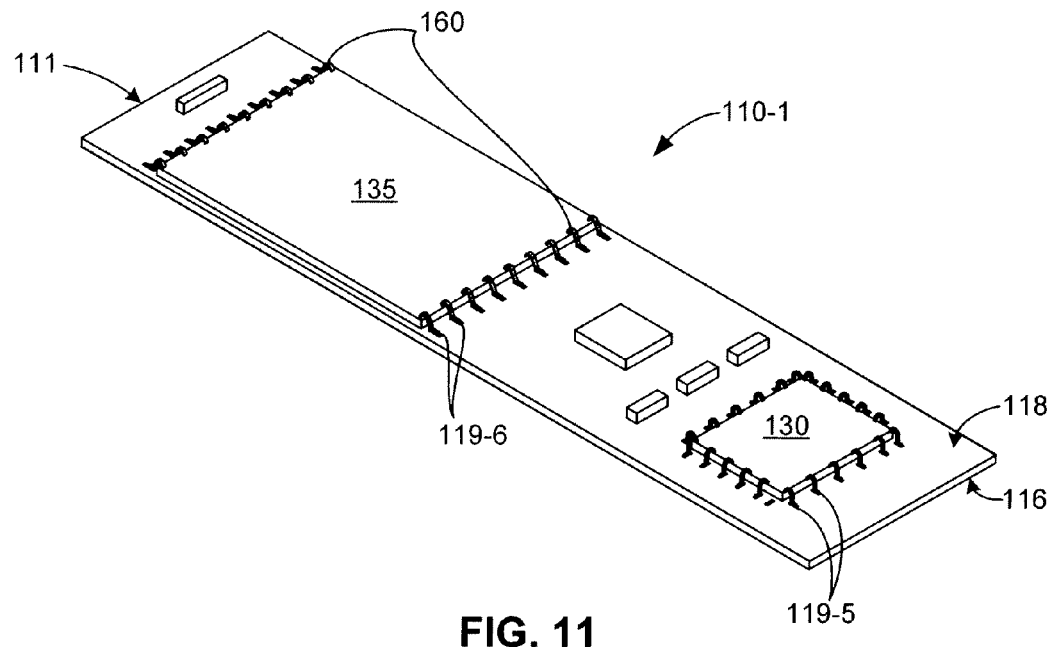
FIG. 11 is a perspective view depicting a wire bonding process utilized to connect the IC dies of FIG. 8(C) to corresponding contact pads disposed on a PCB according to the method of FIG. 3.
Figure 12:
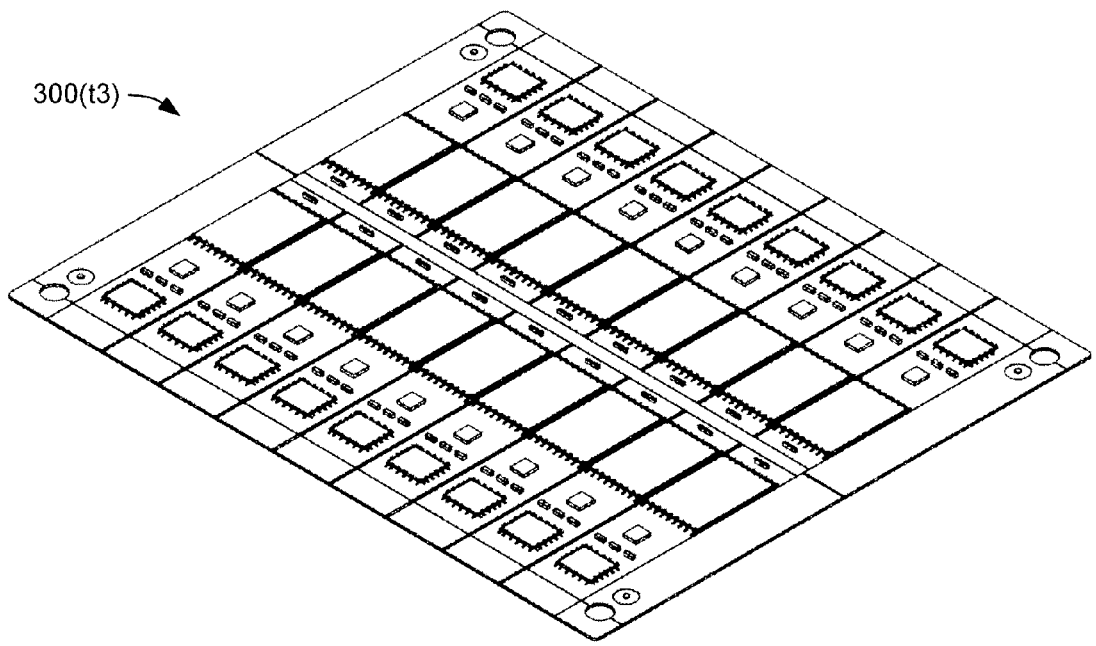
FIG. 12 is a top perspective views showing the PCB panel of FIG. 4(B) after the wire bonding process is completed.

FIG. 11 is a perspective view depicting a wire bonding process utilized to connect the IC dies 130 and 135 to corresponding contact pads 119-5 and 119-6, respectively, according to block 248 of FIG. 3. The wire bonding process proceeds as follows. Once a full magazine of PCB panels 300 (t2) (see FIG. 10) has completed the die bonding operation, an operator transports the PCB panels 300 (t2) to a nearby wire bonder (WB) machine, and loads the PCB panels 300 (t2) onto the magazine input rack of the WB machine. The WB machine is pre-prepared with the correct program to process this specific USB device. The coordinates of all the ICs' pads 119-5 and 119-6 and PCB gold fingers were previously determined and programmed on the WB machine. After the PCB panel with the attached dies is loaded at the WB bonding area, the operator commands the WB machine to use optical vision to recognize the location of the first wire bond pin of the first memory die of the first PCB on the panel. Once the first pin is set correctly, the WB machine can carry out the whole wire bonding process for the rest of the panels of the same product type automatically. For multiple flash layer stack dies, the PCB panels may be returned to the WB machine to repeat wire bonding process for the second stack. FIG. 12 is a top perspective views showing PCB panel 300 (t3) after the wire bonding process is completed.

Figure 13A:
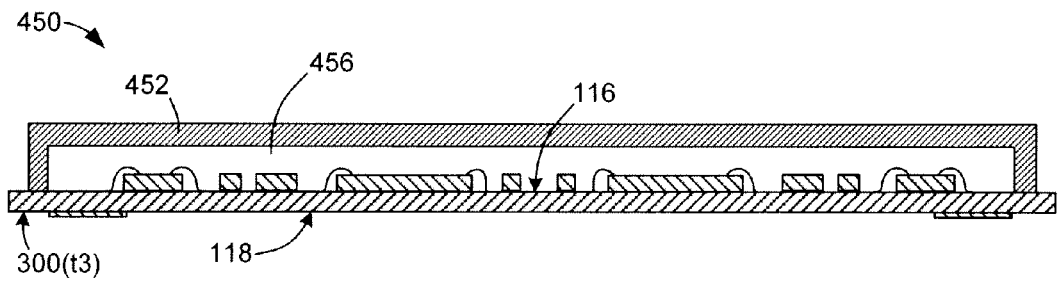
FIGS. 13(A) and 13(B) are simplified cross-sectional side views depicting a molding process for forming a molded housing over the PCB panel of FIG. 4(B) according to the method of FIG. 3.
Figure 13B:
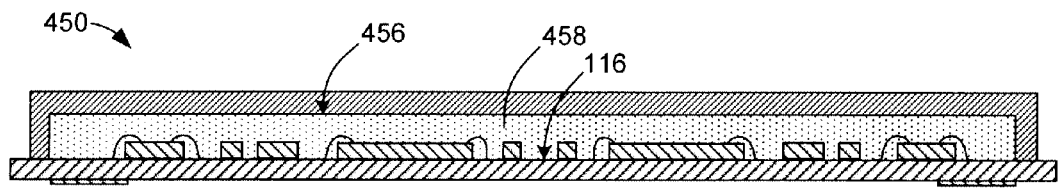
Figure 14:
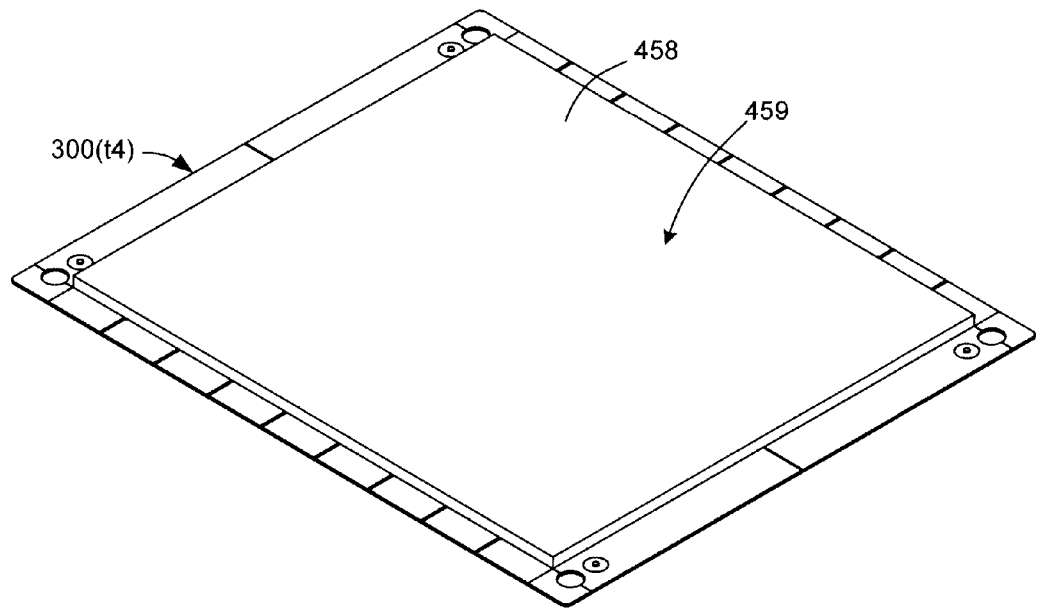
FIG. 14 is a top perspective views showing the PCB panel of FIG. 4(B) after the molding process is completed.

FIGS. 13(A) and 13(B) are simplified cross-sectional side views depicting a molding process for forming a molded housing layer over PCB panel 300 (t3) according to block 250 of FIG. 3. As indicated in FIG. 13(A), after the wire bonding process is completed, USB panel 300 (t3) is loaded into a mold machine 450 including a cover plate 452 that mounts onto lower surface 116 of PCB panel 300 (t3), and defines a chamber 456 that is disposed over the IC chips, wire bonds and passive components that are mounted on lower surface 116. Note that no molding material is applied to upper surface 118. Transfer molding is prefer here due to the high accuracy of transfer molding tooling and low cycle time. The molding material in the form of pellet is preheated and loaded into a pot or chamber (not shown). As depicted in FIG. 13(B), a plunger (not shown) is then used to force the material from the pot through channels known as a spruce and runner system into the mold cavity 456, causing the molten (e.g., plastic) material to form a molding layer 458 that encapsulates all the IC chips and components, and to cover all the exposed areas of lower surface 116. The mold remains closed as the material is inserted and filled up all vacant in cavity 456. During the process, the walls of cover plate 452 are heated to a temperature above the melting point of the mold material, which facilitates a faster flow of material through cavity 456. Mold machine 450 remains closed until a curing reaction within the molding material is complete. A cooling down cycle follows the injection process, and the molding materials of molding layer 458 start to solidify and harden. Ejector pins push PCB panel 300 (t4) (shown in FIG. 14) from the mold machine once molding layer 458 has hardened sufficiently. As depicted in FIG. 14, molding layer 458 forms a uniform block with a flat, smooth upper surface 459 on PCB panel 300 (t4).

Figure 15:
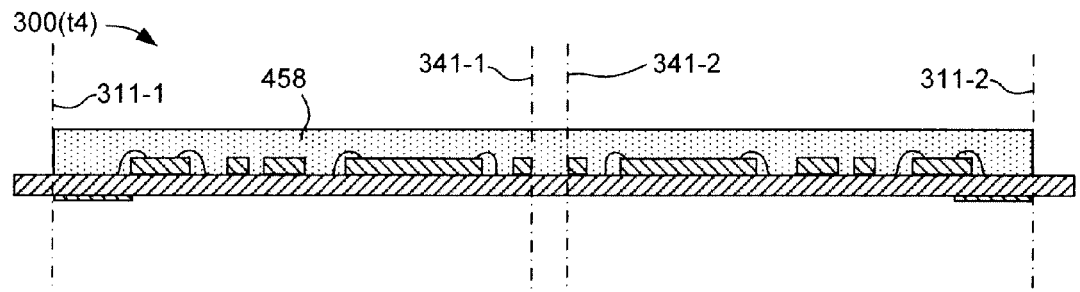
FIG. 15 is simplified cross-sectional side view depicting a singulation process for separating the PCB panel of FIG. 4(B) into individual USB devices according to the method of FIG. 3.
Figure 16A:
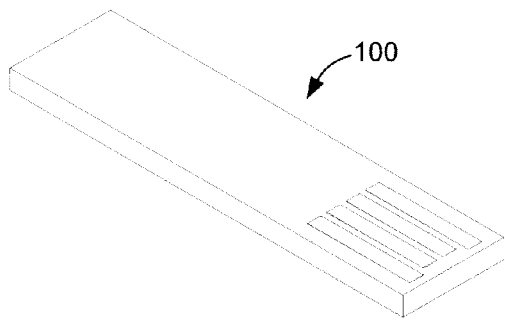
FIGS. 16(A) and 16(B) are bottom and top perspective views showing USB devices after the singulation process of FIG. 3 is completed.
Figure 16B:
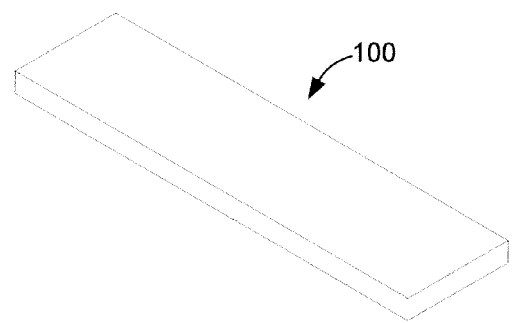

FIG. 15 is simplified cross-sectional side view depicting a singulation process according to block 260 of FIG. 3 that is used to separate PCB panel 300 (t4) into individual USB devices. PCB panel 300 (t4) is loaded into a saw machine (not shown) that is pre-programmed with a singulation routine that includes predetermined cut locations. The saw blade is aligned to the first cut line (e.g., end cut line 311-1) as a starting point by the operator. The coordinates of the first position are stored in the memory of the saw machine. The saw machine then automatically proceeds to cut up (singulate) the USB pane 300 (t4), for example, successively along cut lines 311-1, 341-1, 341-2, and 311-2, and then along the side cut lines and PCB cut lines (see FIG. 4(A)) to form individual USB devices according to the pre-programmed singulation routine. FIGS. 16(A) and 16(B) are top and bottom perspective views showing a modular USB core component 100 after the singulation process is completed.

Figure 17A:
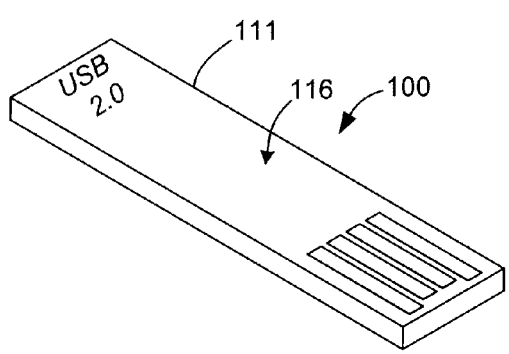
FIGS. 17(A) and 17(B) are bottom and top perspective views showing the modular USB device of FIG. 16(A) after a marking process is performed in accordance with the method of FIG. 3.
Figure 17B:
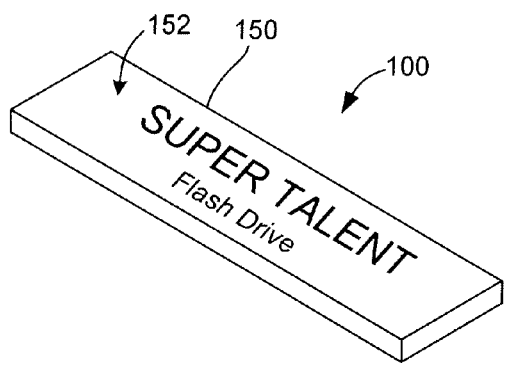

FIGS. 17(A) and 17(B) are top and bottom perspective views showing a singulated modular USB core component 100 after a marking process is performed in accordance with block 270 of the method of FIG. 3. The singulated and completed USB devices 100 undergo a marking process in which a designated company's logo, USB logo, RoHs logo, speed value, density value, or other related information are printed on surface 152 of housing 150 and/or upper surface 116 of PCB 111. After marking, USB devices 100 are placed in the baking oven to cure the permanent ink.

Referring to block 280 located at the bottom of FIG. 3, a final procedure in the manufacturing method of the present invention involves testing, packing and shipping the individual USB devices. The marked USB devices 100 shown in FIGS. 17(A) and 17(B) are then subjected to visual inspection and electrical tests consistent with well established techniques. Visually or/and electrically test rejects are removed from the good population as defective rejects. The good memory cards are then packed into custom made boxes which are specified by customers. The final packed products will ship out to customers following correct procedures with necessary documents.

As suggested in the above example, in addition to reducing overall manufacturing costs by utilizing unpackaged controller and flash memory dies (i.e., by eliminating the packaging costs associated with SMT-ready controller and flash memory devices), the present invention provides a further benefit of facilitating greatly expanded memory capacity without increasing the overall size of modular USB core component 100. For example, FIG. 18 is simplified cross-sectional side view showing a stacked-memory USB device 500 in which a first flash memory chip 535-1 is mounted on a lower surface 518 and connected by first wire bonds 560-1 to PCB 511 in the manner described above. Because the IC die height (thickness) D is much smaller than packaged flash memory devices, and because the thickness T1 of USB device 500 is set, for example, at 2.0 mm to assure a snug fit of plug structure 105 inside lower region 25A of female USB socket connector 22 (as discussed above with reference to FIG. 2(B), the present invention facilitates a stacked memory arrangement in which a second flash memory die 535-2 is mounted on first flash memory die 535-1 and connected to PCB 511 by way of second wire bonds 560-2. In an alternative embodiment (not shown), second flash memory die 535-2 may be connected to contacts provided on first flash memory die 535-1 by associated wire bonds. This stacked memory arrangement greatly increases memory capacity of the USB devices without increasing the footprint (i.e., thickness T1, length and width) of modular USB core component 500.

Figure 20:
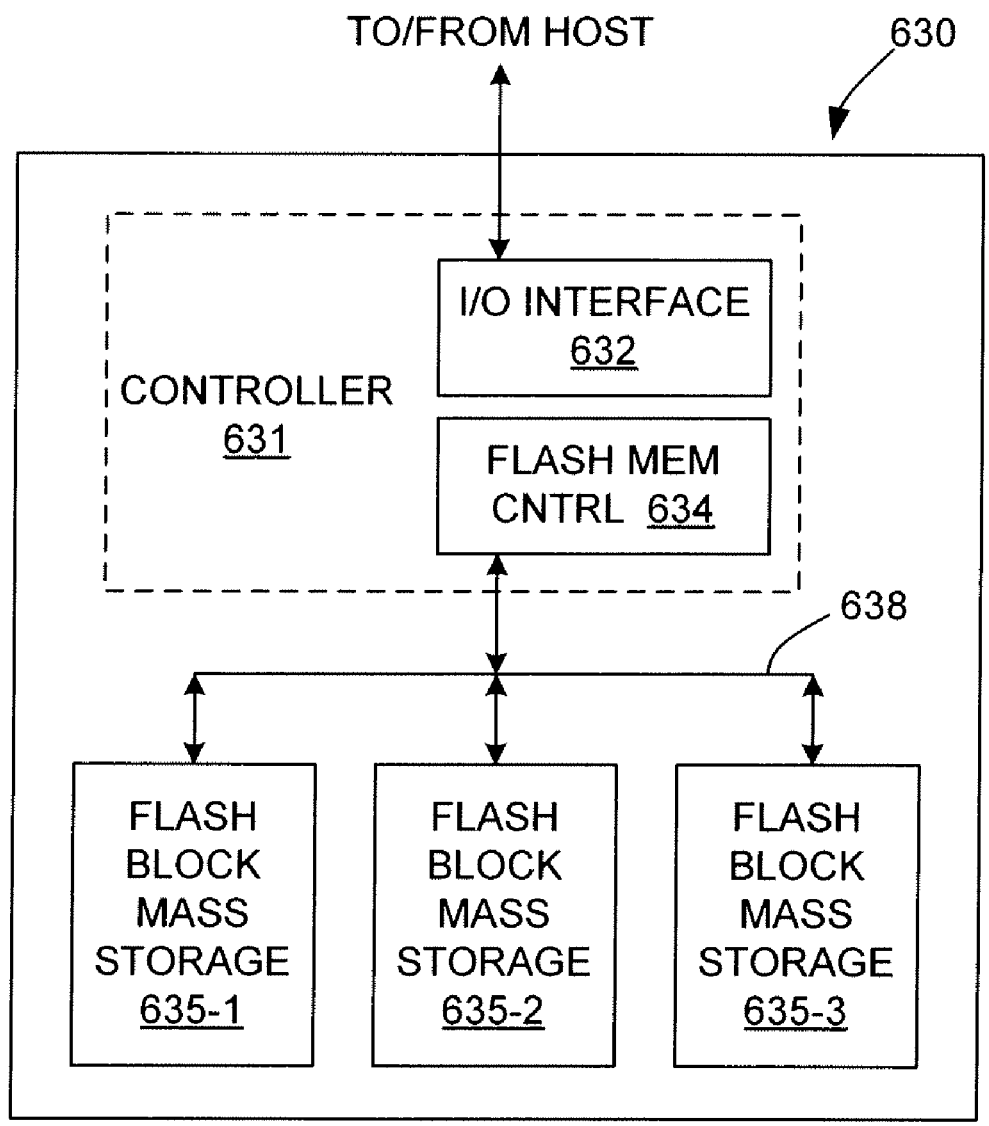
FIG. 20 is a block diagram showing a flash microcontroller integrated circuit die with flash mass storage blocks.

FIG. 19 is simplified cross-sectional side view showing a modular USB core component 600 including stacked-memory according to another embodiment of the present invention. Modular USB core component 600 is distinguished over the previous embodiments in that, instead of separate USB controller and flash memory chips, USB device 600 utilizes a single-chip controller/flash die 630 that is connected to a PCB 611 by way of wire bonds 660 in the manner described above, and is characterized in that, as shown in FIG. 20, single-chip controller/flash die 630 includes both a controller circuit 631 and one or more flash block mass storage circuits 635-1 to 635-3 that are interconnected by a bus 638. Controller circuit 631 includes an input/output (I/O) interface circuit 632 that facilitates sending and receiving commands and data to/from a host (not shown) into which USB device 600 is plugged. Controller circuit 631 also includes a flash-memory controller 634 that facilitates sending and receiving sends data over one or more internal flash buses 638 to/from flash mass storage blocks 635-1, 635-2, 635-3. Because internal flash bus 638 is internal to single-chip controller/flash die 630, external pins are not required for the interface to flash memory blocks 635-1, 635-2, 635-3. In one embodiment, flash mass storage blocks 635-1, 635-2, 635-3 are not randomly accessible. Instead, a command and an address are transferred as data over internal flash bus 638 to indicate a block of data to transfer from flash mass storage blocks 635-1, 635-2, 635-3. Thus, flash mass storage blocks 635-1, 635-2, 635-3 are block-addressable mass storage, rather than random-access memory (RAM). In another embodiment, flash mass storage blocks 635-1, 635-2, 635-3 are aggregated together by the flash microcontroller of controller circuit 631 631, which maps and directs data transactions to selected flash storage blocks 635-1, 635-2, 635-3. Because the flash microcontroller 631 performs memory management, flash storage blocks 635-1, 635-2, 635-3 appear as a single, contiguous memory to external hosts. Additional details regarding the use of single-chip controller/flash die 630 is provided in co-owned U.S. Pat. No. 7,103,684, which is incorporated herein by reference in its entirety.

In accordance with another aspect of the present invention, the modular USB core components described in the embodiments above are incorporated into package casings (cases) in order to form completed USB assemblies (i.e., USB devices suitable for sale to an end user). Several examples of such USB assemblies are described in the following paragraphs that are generally characterized as including two versions of low-profile package casings (one with front ribs and the other without front ribs). In addition, different package assembly process methods are described in which the modular USB core component is mounted or otherwise disposed inside a case to produce a final memory card product. For brevity, a generalized modular USB core component 100 is used in the following examples and represents any of the embodiments described above.

Figure 21:
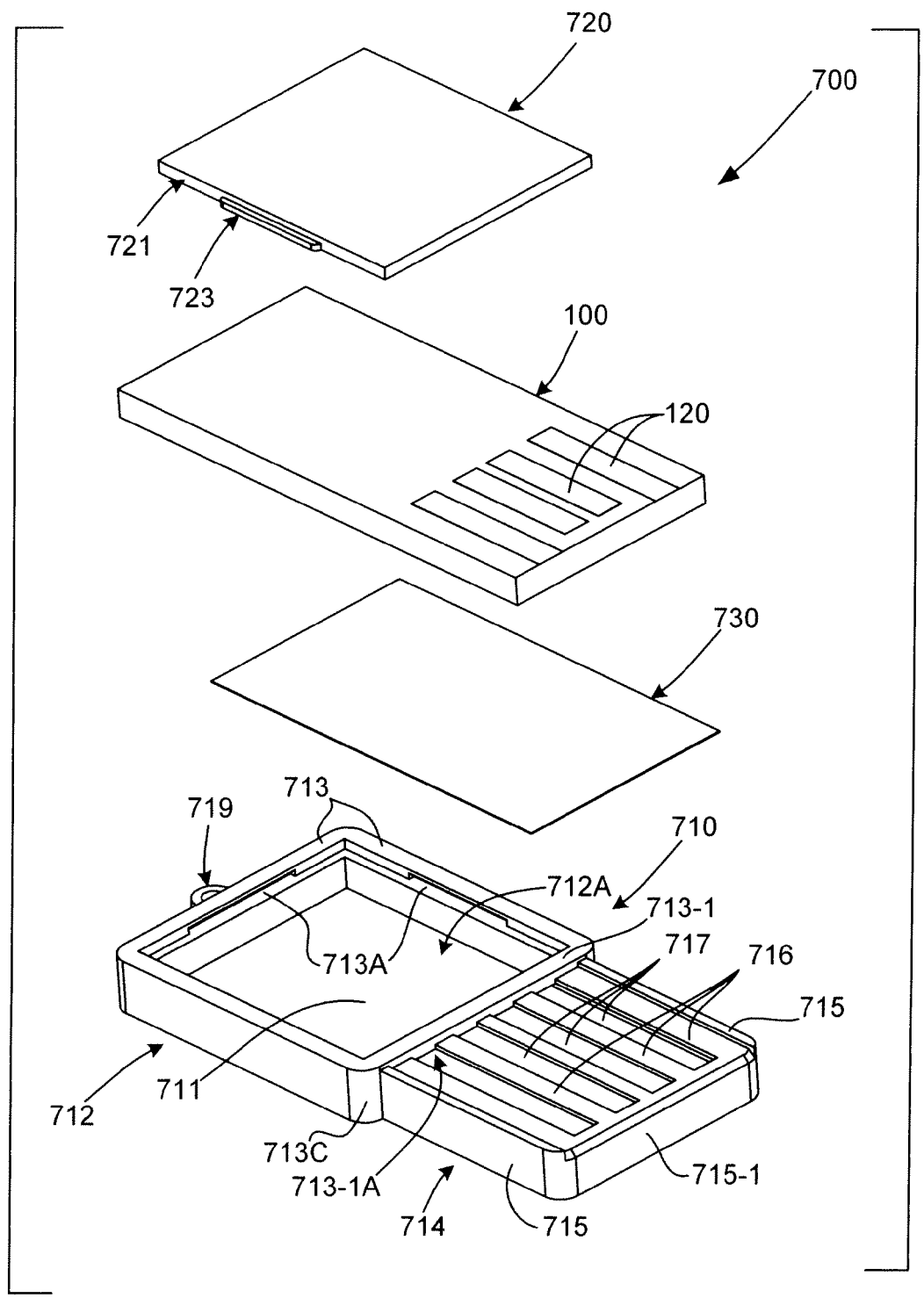
FIG. 21 is an exploded perspective view showing a USB assembly with a full metal case according to another embodiment of the present invention.

FIG. 21 is an exploded perspective view showing an USB assembly 700 including a case 710 for receiving modular USB core component 100 inside, a cover plate 720, and an adhesive 730. In the present embodiment, case 710 is a one-piece pre-molded plastic casing formed using known techniques to include a bottom wall 711, a relatively wide rear section 712 formed by rear side walls 713, and a relatively narrow front section 714 formed by front side walls 715. The terms "one-piece" and "pre-molded" are used herein to indicate that case 710 is an integral molded structure formed during a single (e.g., injection) plastic molding process that is performed prior to assembly with modular USB core component 100. An intermediate wall 713-1 of case 710 is disposed between rear section 712 and front section 714, and defines a slot 713-1A. Rear section 712 defines an upper opening 712A that exposes an elongated cavity extending between rear section 712 and front section 714 by way of slot 713-1A. Rear side walls 713 are slightly taller and wider than front side walls 715 to facilitate mounting cover plate 720, and define notches (sills) 713A on an inside surfaces thereof for snap-coupling cover plate 720 in the manner described below. Front section 714 includes a series of parallel ribs 716 that extend over the cavity and are separated by elongated openings 717. A circular donut structure 719 (shown more completely in FIG. 22(B)) is integrally molded or otherwise attached at the backend of the rear section 712, and allows a small chain or string to loop through a hole defined therethrough to form a key chain holder, or may be used for hanging ornaments with decorative string. Round shallow shoulders 713C are provided at the interface of rear section 712 and narrower front section 714.

Figure 22A:
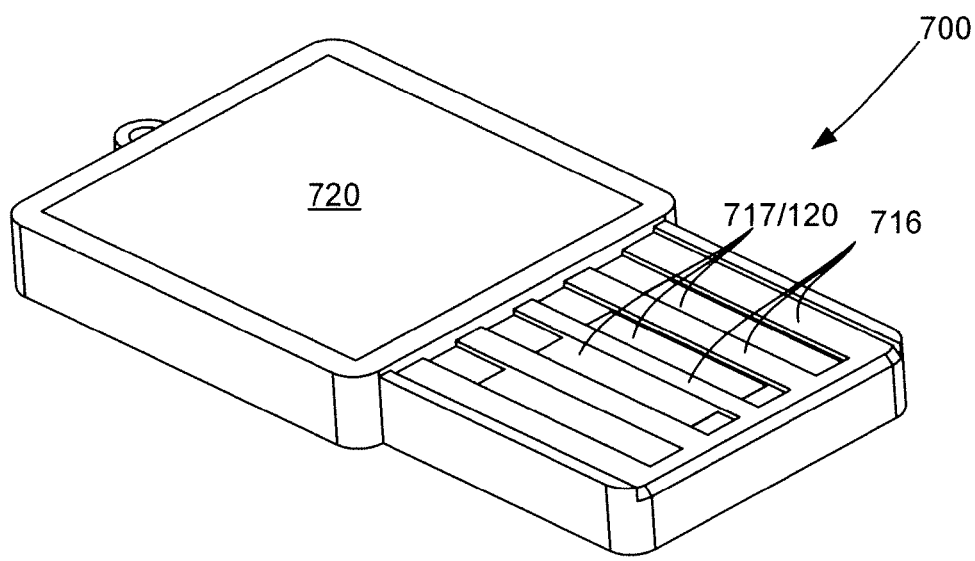
FIGS. 22(A) and 22(B) are front perspective and rear perspective views showing the USB assembly of FIG. 21 in an assembled state.
Figure 22B:
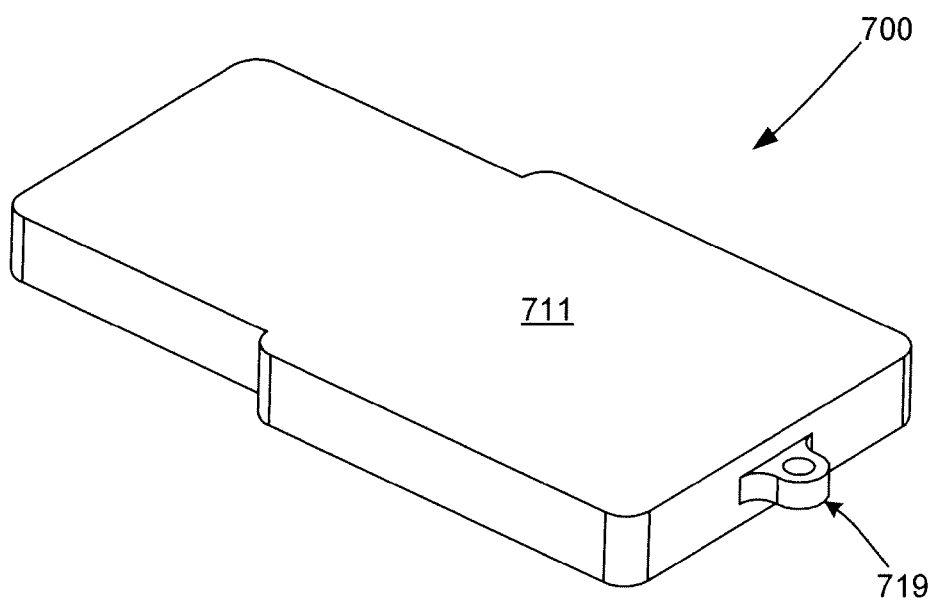

During assembly, a double sided thermal adhesive tape 730 is placed inside the cavity defined by case 710, and then USB core component 100 is inserted through upper opening 712A such that adhesive tape 730 is disposed between lower wall 711 and the lower surface of modular USB core component 100. Modular USB core component 100 is inserted into case 710 with metal contacts 120 facing upward (away from lower wall 711) and disposed toward front section 714. Modular USB core component 100 is held at an angle relative to case 710 during insertion to facilitate insertion of its front edge (i.e., the edge adjacent to metal contacts 120) through upper opening 712A and through slot 713A formed between rear section 712 and front section 714. USB component 100 is then pushed forward until its front edge abuts a front wall 715-1 and metal contacts 120 are exposed through openings 717 formed between ribs 716 (as shown in FIG. 22(A)), at which point a rear end of modular USB core component 100 is inserted and snugly fit into the cavity below upper opening 712A. Next, cover plate 720 is mounted over upper opening 712A to seal the cavity defined by case 710. In the present embodiment, cover plate 720 has protruding notches 723 disposed on peripheral side edges 721 that are snap coupled into recesses 713A defined along the inner surface of rear side walls 713. After cover plate 720 has been snapped onto case 710 to seal modular USB core component 100 inside the cavity, a thermal cure procedure is performed to enhance the bond strength of double sided thermal adhesive tape 730, thereby completing the assembly process. Completed USB assembly 700 is shown in top front perspective view in FIG. 22(A) and in bottom rear perspective view in FIG. 22(B).

Figure 23A:
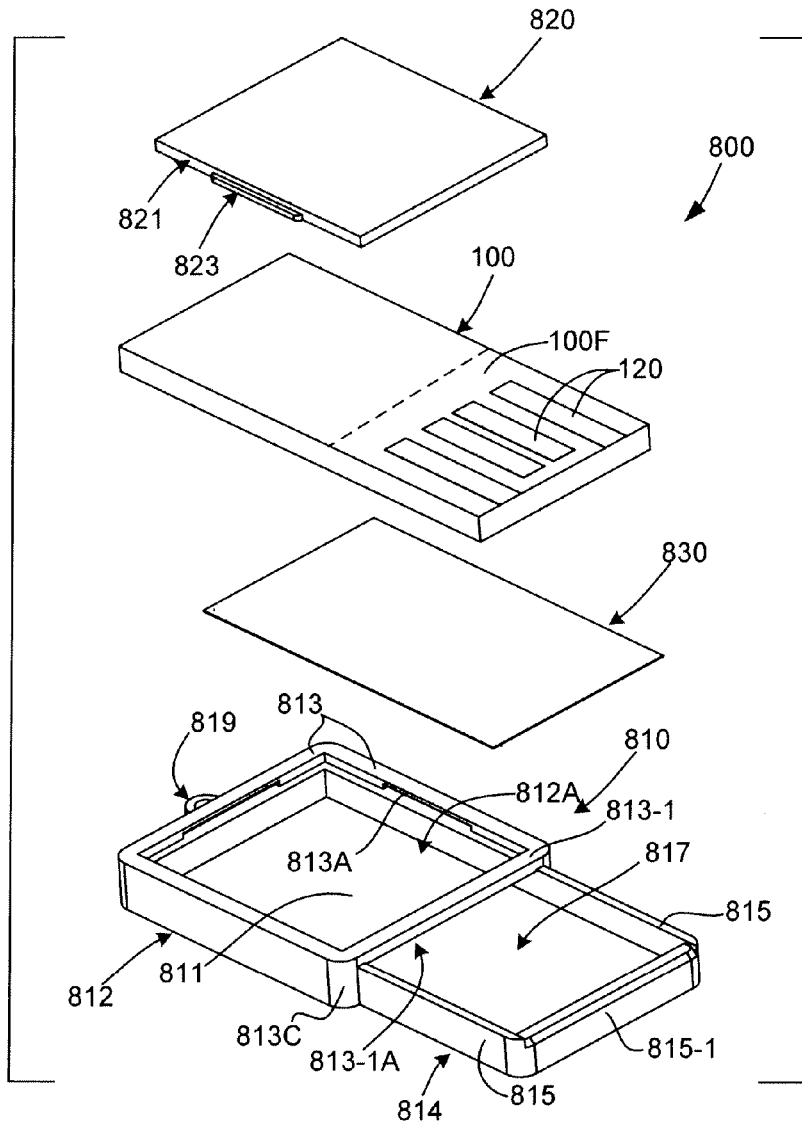
FIGS. 23(A), 23(B) and 23(C) are exploded perspective, front assembled perspective and rear assembled perspective views showing a USB assembly according to another embodiment of the present invention.

FIG. 23(A) is an exploded perspective view showing an USB assembly 800 according to an alternative embodiment of the present invention, which includes a one-piece pre-molded plastic casing (case) 810 that is formed to receive modular USB core component 100 inside, a cover plate 820, and an adhesive 830. Like case 710 (discussed above), case 810 includes a bottom wall 811, a relatively wide rear section 812 formed by rear side walls 813, and a relatively narrow front section 814 formed by front side walls 815. An intermediate wall 813-1 is disposed between rear section 812 and front section 814, and defines a slot 813-1A. Rear section 812 defines an upper opening 812A that exposes an elongated cavity extending between rear section 812 and front section 814 by way of slot 813-1A. Rear side walls 813 define notches 813A on an inside surface thereof for snap-coupling cover plate 820 in the manner described below. Unlike case 710, front section 814 of case 810 includes a large opening 817 whose purpose is to expose the entirety of a front section 100F of modular USB core component 100 (i.e., the section to the right of the dashed line in FIG. 23(A) including metal contacts 120). A circular donut structure 819 is integrally molded or otherwise attached at the backend of the rear section 812.

Figure 23B:
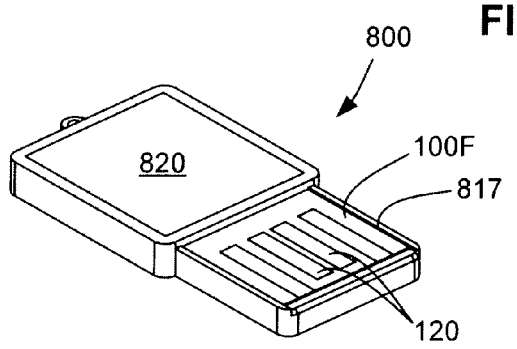
Figure 23C:
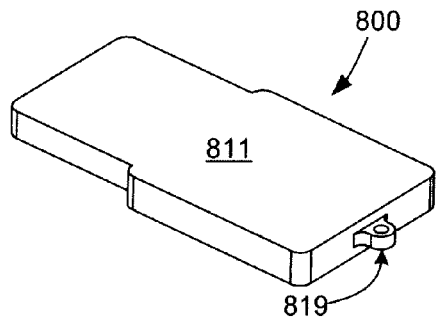

During assembly, a double sided thermal adhesive tape 830 is placed inside the cavity defined by case 810, and then USB core component 100 is inserted through upper opening 812A such that adhesive tape 830 is disposed between lower wall 811 and the lower surface of modular USB core component 100. Modular USB core component 100 is inserted into plastic mold casing 810 with metal contacts 120 facing upward (away from lower wall 811) such that front section 100F is disposed toward front section 814. Modular USB core component 100 is held at an angle relative to casing 810 during insertion to facilitate insertion of its front edge (i.e., the edge adjacent to metal contacts 120) through upper opening 812A and through slot 813A formed between rear section 812 and front section 814. USB component 100 is then pushed forward until its front edge abuts front wall 815-1 and front section 100F (including metal contacts 120) is exposed through opening 817 (as shown in FIG. 23(B)), at which point a rear end of modular USB core component 100 is inserted and snugly fit into the cavity below upper opening 812A. Next, cover plate 820 is mounted over upper opening 812A by snap coupling notches 823 disposed on peripheral side edges 821 into recesses 813A defined along the inner surface of rear side walls 813. After cover plate 820 has been snapped onto casing 810 to seal modular USB core component 100 inside the cavity, a thermal cure procedure is performed to enhance the bond strength of double sided thermal adhesive tape 830, thereby completing the assembly process. The completed USB assembly 800 is shown in front perspective view in FIG. 23(B) and in rear perspective view in FIG. 23(C).

Figure 24A:
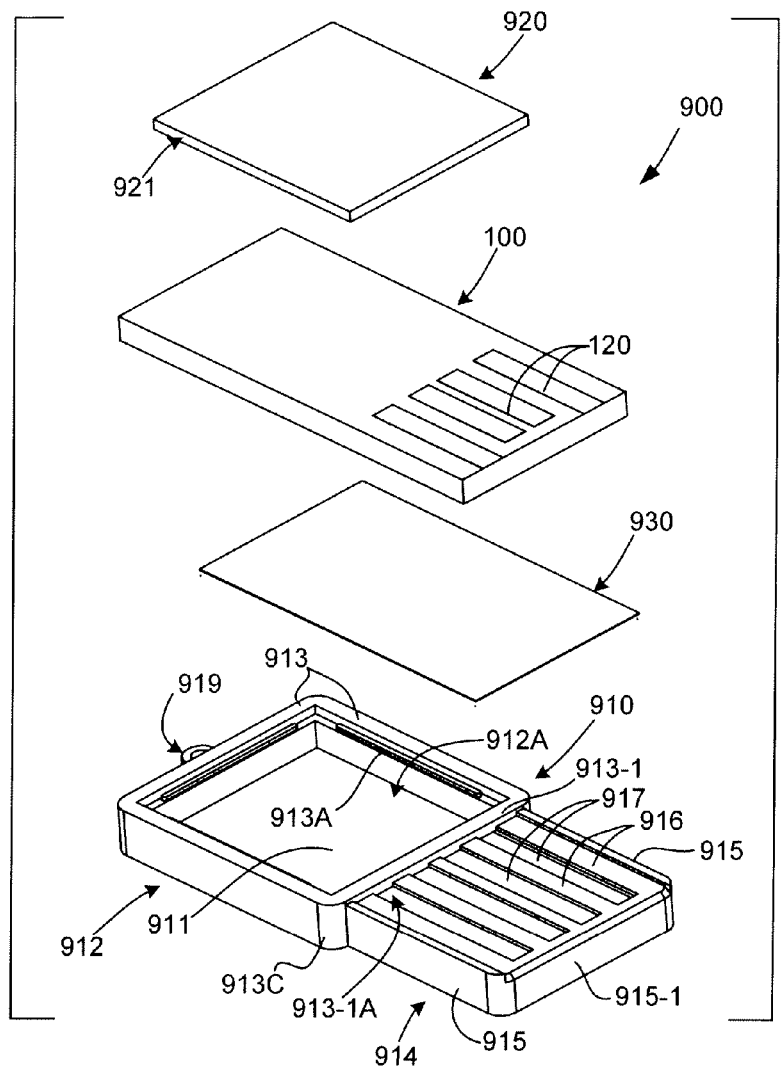
FIGS. 24(A), 24(B) and 24(C) are exploded perspective, front assembled perspective and rear assembled perspective views showing a USB assembly according to another embodiment of the present invention.

FIG. 24(A) is an exploded perspective view showing an USB assembly 900 according to an alternative embodiment of the present invention, which includes a one-piece pre-molded plastic casing (case) 910 that is formed to receive modular USB core component 100 inside, a cover plate 920, and an adhesive 930. Like case 710 (discussed above), case 910 includes a bottom wall 911, a relatively wide rear section 912 formed by rear side walls 913, and a relatively narrow front section 914 formed by front side walls 915. An intermediate wall 913-1 is disposed between rear section 912 and front section 914, and defines a slot 913-1A. Rear section 912 defines an upper opening 912A that exposes an elongated cavity extending between rear section 912 and front section 914 by way of slot 913-1A. Rear side walls 913 define perimeter edges 913A formed on an inside surface thereof for snap-coupling cover plate 920 in the manner described below. A circular donut structure 919 is integrally molded or otherwise attached at the backend of the rear section 912.

Figure 24B:
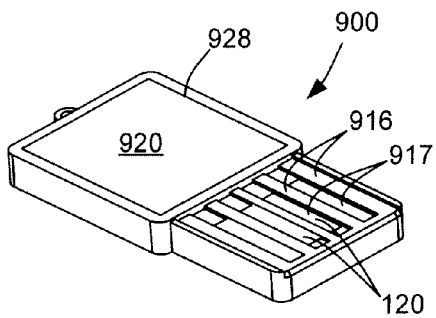
Figure 24C:
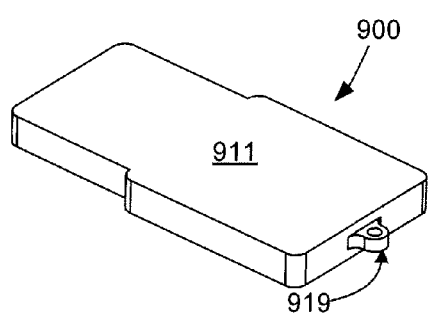

During assembly, a double sided thermal adhesive tape 930 is placed inside the cavity defined by case 910, and then USB core component 100 is inserted through upper opening 912A such that adhesive tape 930 is disposed between lower wall 911 and the lower surface of modular USB core component 100. Modular USB core component 100 is inserted into plastic mold casing 910 with metal contacts 120 facing upward (away from lower wall 911) such that front section 100F is disposed toward front section 914 and metal contacts 120 are exposed through openings 917 and separated by ribs 916 (as shown in FIG. 24(B)). Next, cover plate 920 is mounted over upper opening 912A such that its outer edge 921 aligns with perimeter edges 913A defined along the inner surface of rear side walls 913. In accordance with the present embodiment, outer edge 921 is provided with a rough finish (not shown) to facilitate ultrasonic welding to perimeter edges 913A. The assembly is then placed under an ultrasonic machine that applies ultra high frequency and compressive pressure onto cover plate 920, thereby causing outer edge 921 to melt and fuse with perimeter edges 913A, thereby securing cover plate 920 to case 910. After cover plate 920 has been secured such that modular USB core component 100 is sealed inside the cavity, a thermal cure procedure is performed to enhance the bond strength of double sided thermal adhesive tape 930, thereby completing the assembly process. The completed USB assembly 900 is shown in front perspective view in FIG. 24(B) and in rear perspective view in FIG. 24(C).

Figure 25A:
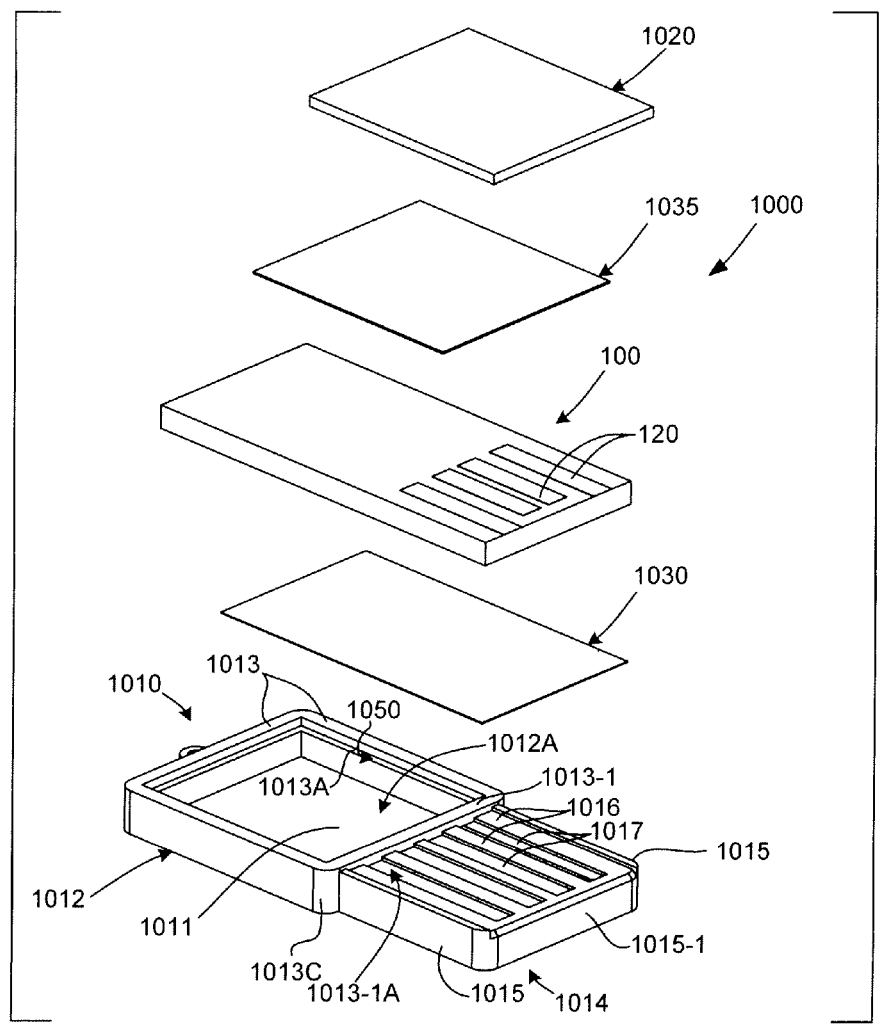
FIGS. 25(A) and 25(B) are exploded perspective and front assembled perspective views showing a USB assembly according to another embodiment of the present invention.

FIG. 25(A) is an exploded perspective view showing an USB assembly 1000 according to another alternative embodiment of the present invention, which includes a one-piece pre-molded plastic casing (case) 1010 that is formed to receive modular USB core component 100 inside, a cover plate 1020, a lower adhesive layer 1030 and an upper adhesive layer 1035. Like case 710 (discussed above), case 1010 includes a bottom wall 1011, a relatively wide rear section 1012 formed by rear side walls 1013, and a relatively narrow front section 1014 formed by front side walls 1015. An intermediate wall 1013-1 is disposed between rear section 1012 and front section 1014, and defines a slot 1013-1A. Rear section 1012 defines an upper opening 1012A that exposes an elongated cavity extending between rear section 1012 and front section 1014 by way of slot 1013-1A. Rear side walls 1013 define a groove/platform 1013A on an inside surface thereof for securing side edges 1021 of cover plate 1020 in the manner described below. Front section 1014 of case 1010 includes ribs 1016 that define elongated openings 1017 therebetween whose purpose is to expose metal contacts 120 of modular USB core component 100.

Figure 25B:
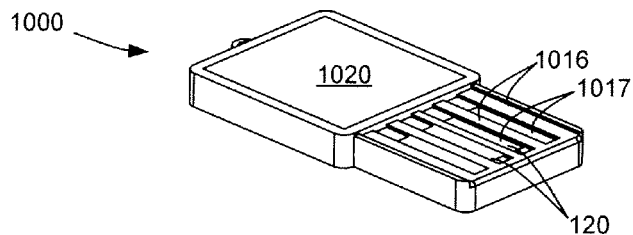

During assembly, a double sided thermal adhesive tape (adhesive layer) 1030 is placed inside the cavity defined by case 1010, and then USB core component 100 is inserted through upper opening 1012A in the manner described above such that USB component 100 is pushed forward until its front edge abuts front wall 1015-1 and front section 100F, and metal contacts 120 are exposed through openings 1017 (as shown in FIG. 25(B)). Next, cover plate 1020 is mounted over upper opening 1012A and onto platform 1013A with upper adhesive layer 1035 (also a double sided thermal adhesive tape) disposed between a lower surface of cover plate 1020 and an upper surface of USB core component 100. After cover plate 1020 is thus partially secured to case 1010 and USB core component 100, a thermal cure procedure is performed to enhance the bond strength of double sided thermal adhesive tapes 1030 and 1035, thereby securing cover plate to case 1010 by adhesive layer 1035 and completing the assembly process. The completed USB assembly 1000 is shown in front perspective view in FIG. 25(B) and in rear perspective view in FIG. 25(C).

Referring again to FIG. 25(A), in accordance with another alternative embodiment of the present invention, instead of securing cover plate 1020 by way of upper adhesive layer 1035, an a ultraviolet light (UV) cured epoxy material is inserted into groove/platform 1013A, and cover plate 1020 is formed from a transparent or translucent material. During assembly, after cover plate 1020 is mounted over opening 1012A, the assembly is passed through a UV cure oven with the recommended light energy and duration specified by the UV-cure epoxy vendor to complete the assembly process.

Figure 26A:
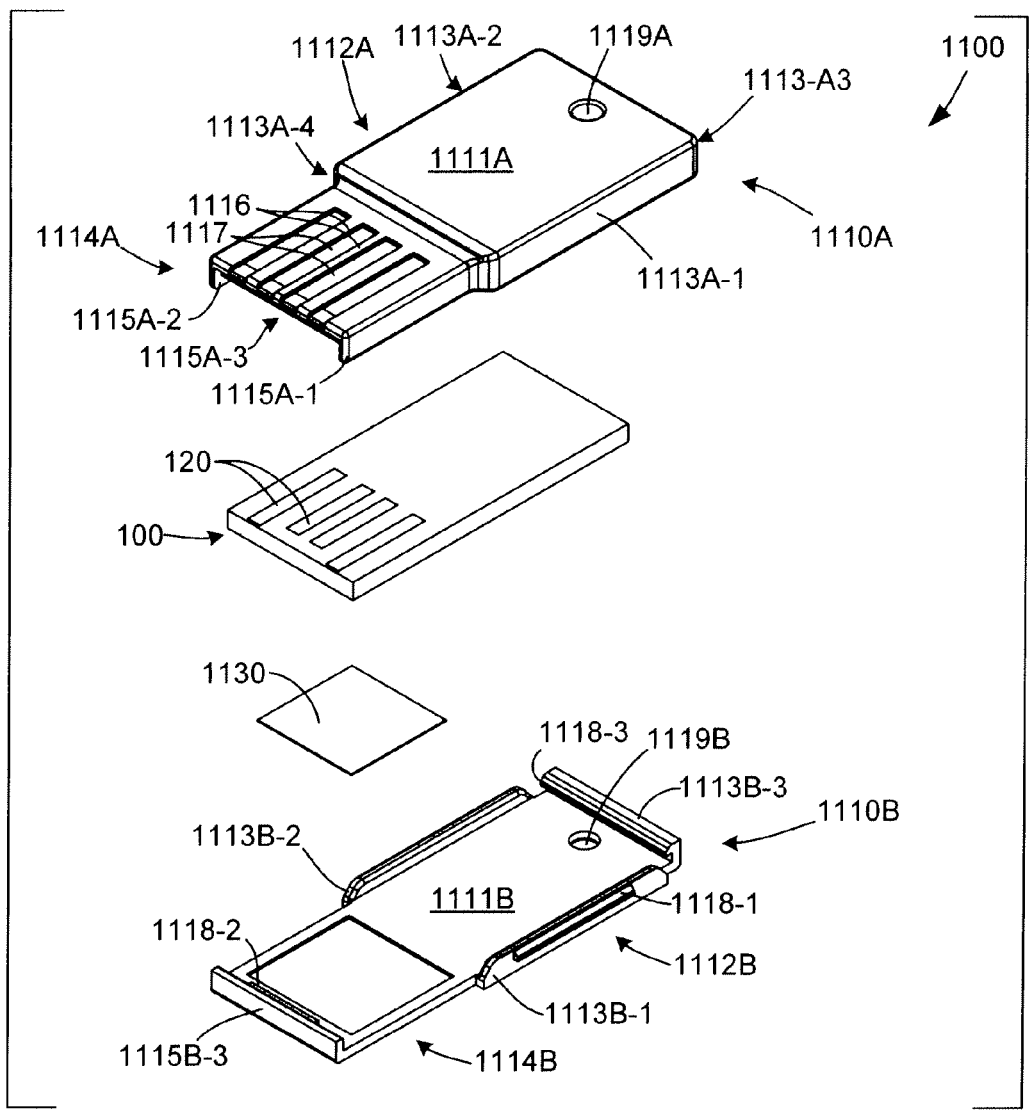
FIGS. 26(A) and 26(B) are exploded perspective and front assembled perspective views showing a USB assembly according to another embodiment of the present invention.
Figure 26B:
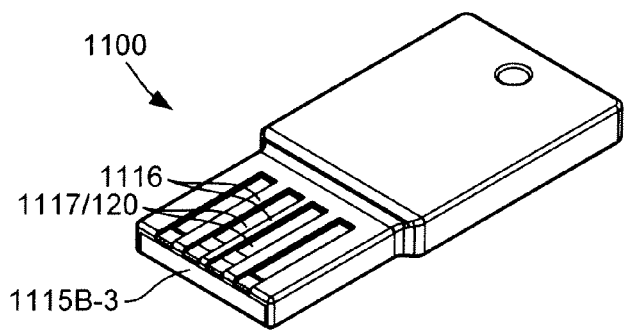

FIG. 26(A) is an exploded perspective view showing an USB assembly 1100 according to another alternative embodiment of the present invention, which includes a two-piece pre-molded plastic casing (case) comprising an upper case portion 1110A and a lower case portion 1110B that are formed to receive modular USB core component 100 inside, and an adhesive layer 1130.

Upper case portion 1110A is a substantially box-shaped structure including a relatively wide rear section 1112A formed by opposing rear side walls 1113A-1 and 1113-A2 and a rear wall 1113A-3 extending downward from an upper wall 1111A, and a relatively narrow front section 1114A formed by opposing front side walls 1115A-1 and 115A-2. Rear section 1112A and front section 1114A collectively define an elongated cavity extending between a front opening 1115A-3 and rear wall 1113A-3. Front section 1114A includes an upper wall (ribs) 1116 that are disposed between upper edges of front side walls 115A-1 and 1115A-2 and define elongated openings 1117 therebetween whose purpose is to expose metal contacts 120 of modular USB core component 100. Shallow shoulders 1113A-4 are formed at the interface between rear section 1112A and front section 1114A. A small through-hole 1119A is defined in upper wall 1111A.

Lower case portion 1110B includes a lower wall 1111B, a rear section 1112B formed by short rear side walls 1113B-1 and 1113B-2 and a rear wall 1113B-3, and a front section 1114B including a front wall 1115B-3. Rear section 1112B includes opposing side walls 1113B-1 and 1113B-2, each including an outwardly facing locking ridge 1118-1 (one shown), and a rear wall 1113B-3 including an inwardly facing locking ridge 1118-3. Front section 1114B includes a front wall 1115B-3 having an inwardly facing locking ridge 1118-2. A small through-hole 1119B is defined in lower wall 1111B, and is aligned with through-hole 1119A when upper case portion 1110A is mounted on lower case portion 1110B.

During assembly, a double sided thermal adhesive epoxy sheet (adhesive layer) 1130 is placed on the inside surface of lower wall 1111B near front wall 1115B-3, and then USB core component 100 is mounted on lower case portion 1110B such that its front edge is engaged by ridge 1118-2 (the rear edge is disposed on lower wall such that a clear path exists between through-holes 1119A and 1119B to allow a small chain or string to loop through to form a key chain holder, or merely uses for hanging ornaments with decorative string. Upper case portion 1110A is then snap coupled onto lower case portion 1110B such that locking ridge 1118-1 (and the locking ridge, not shown, extending from side wall 1113B-2) are snap-coupled into grooves (not shown) defined in side walls 1113A-1 and 1113A-2 of upper case portion 1110A. An optional thermal cure procedure is performed to enhance the bond strength of double sided thermal adhesive tape 1130, thereby further securing lower case portion 1110B to modular USB core component 100. The completed USB assembly 1100 is shown in front perspective view in FIG. 26(B), wherein metal contacts 120 are exposed adjacent to front wall 1115B-3 through openings 1117 defined between ribs 1116.

Figure 27A:
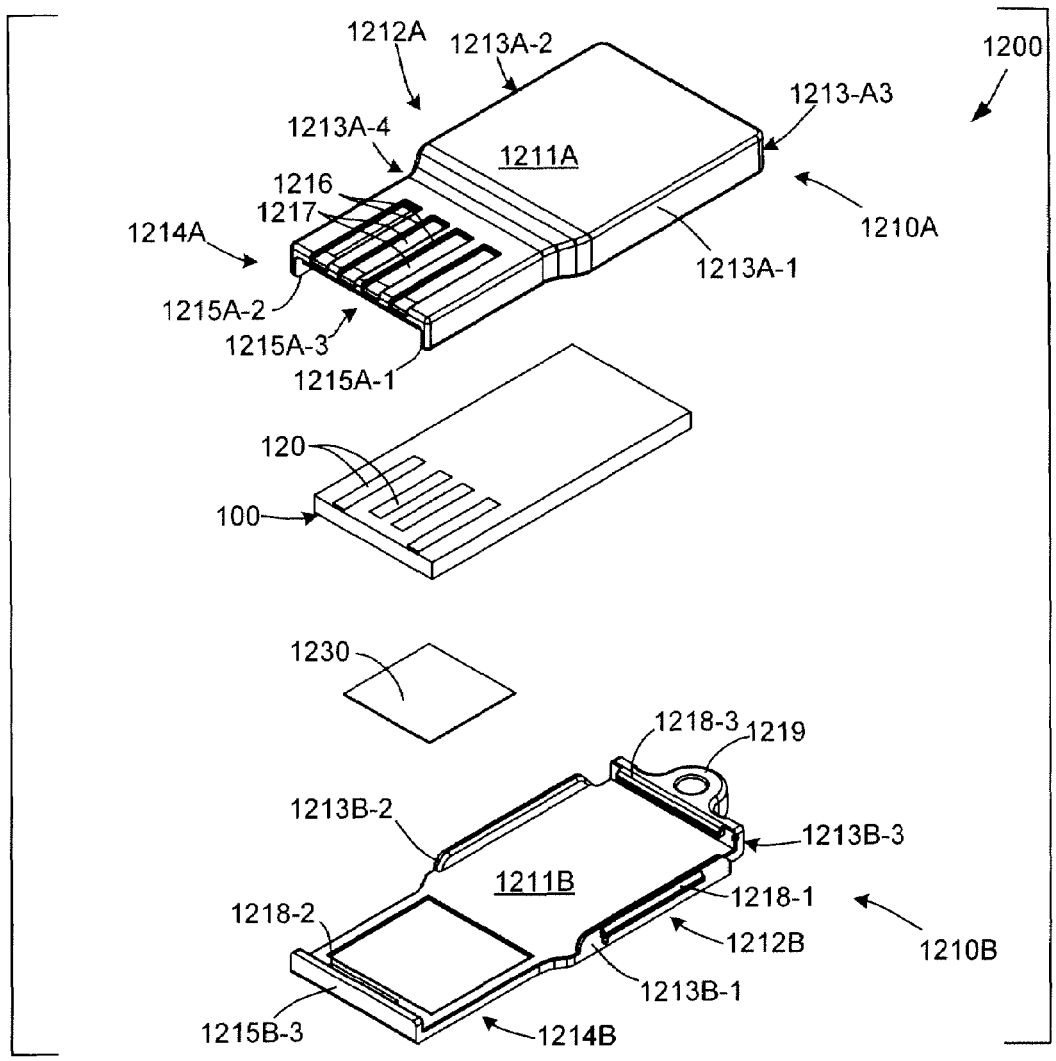
FIGS. 27(A) and 27(B) are exploded perspective and front assembled perspective views showing a USB assembly according to another embodiment of the present invention.
Figure 27B:
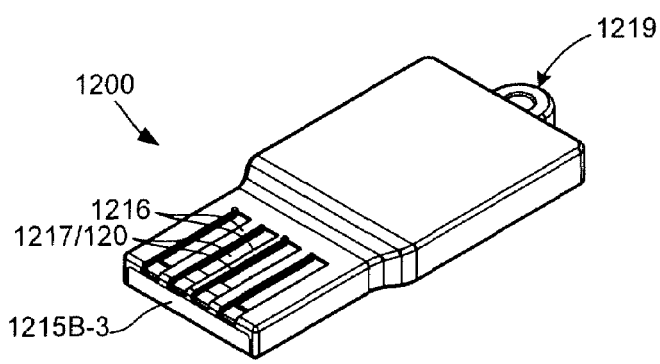

FIG. 27(A) is an exploded perspective view showing an USB assembly 1200 according to another alternative embodiment of the present invention, which includes a two-piece pre-molded plastic casing (case) comprising an upper case portion 1210A and a lower case portion 1210B that are formed to receive modular USB core component 100 inside, and an adhesive layer 1230.

Upper case portion 1210A and lower case 1210B are similar to case portions 1110A and 1110B (discussed above with reference to FIGS. 26(A) and 26(B)), but include a few differences mentioned below. Upper case portion 1210A is a substantially box-shaped structure including a relatively wide rear section 1212A formed by opposing rear side walls 1213A-1 and 1213-A2 and a rear wall 1213A-3 extending downward from an upper wall 1211A, and a relatively narrow front section 1214A formed by opposing front side walls 1215A-1 and 125A-2. Rear section 1212A and front section 1214A collectively define an elongated cavity extending between a front opening 1215A-3 and rear wall 1213A-3. Front section 1214A includes an upper wall (ribs) 1216 that are disposed between upper edges of front side walls 125A-1 and 1215A-2 and define elongated openings 1217 therebetween whose purpose is to expose metal contacts 120 of modular USB core component 100. Shallow shoulders 1213A-4 are formed at the interface between rear section 1212A and front section 1214A. Lower case portion 1210B includes a lower wall 1211B, a rear section 1212B formed by short rear side walls 1213B-1 and 1213B-2 and a rear wall 1213B-3, and a front section 1214B including a front wall 1215B-3. Rear section 1212B includes opposing side walls 1213B-1 and 1213B-2, each including an outwardly facing locking ridge 1218-1 (one shown), and a rear wall 1213B-3 including an inwardly facing locking ridge 1218-3. Front section 1214B includes a front wall 1215B-3 having an inwardly facing locking ridge 1218-2.

Upper case portion 1210A and lower case 1210B differ from case portions 1110A and 1110B (discussed above with reference to FIGS. 26(A) and 26(B)) in that a circular donut structure 1219 extends from back wall 1213B-3 of lower case portion 1210B to mount a key chain etc., instead of the through-holes used in the embodiment of FIGS. 26(A) and 26(B). This arrangement allows upper case portion 1210A and lower case portion 1210B to be formed such that the internal chamber is somewhat shorter that that of the embodiment of FIGS. 26(A) and 26(B), whereby USB core component 100 extends the entire length between front wall 1215B-3 and rear wall 1213B-3 when mounted on lower case portion 1210B. Assembly 1200 is otherwise assembled in a manner similar to that described above with reference to the embodiment of 26(A) and 26(B).

Figure 28A:
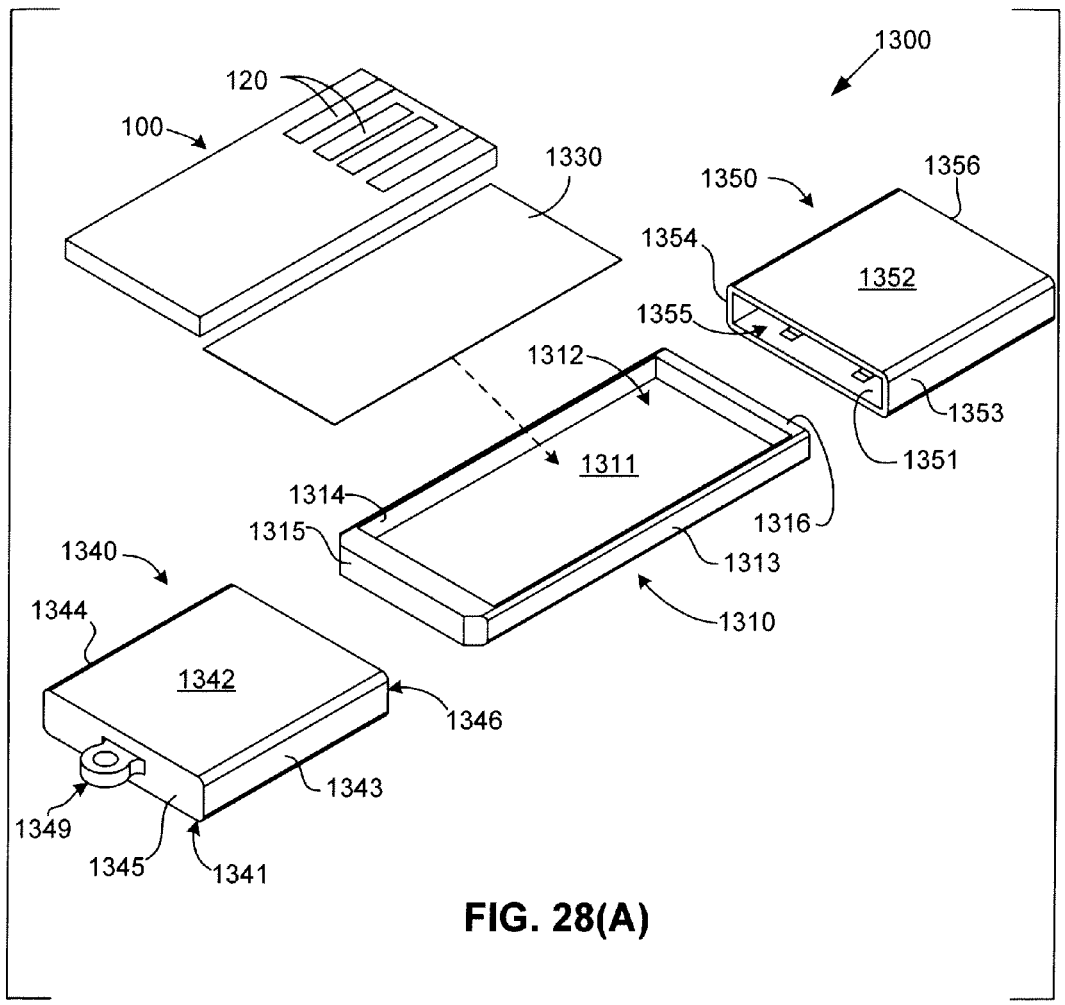
FIGS. 28(A) and 28(B) are exploded perspective and front assembled perspective views showing a USB assembly according to another embodiment of the present invention.
Figure 28B:
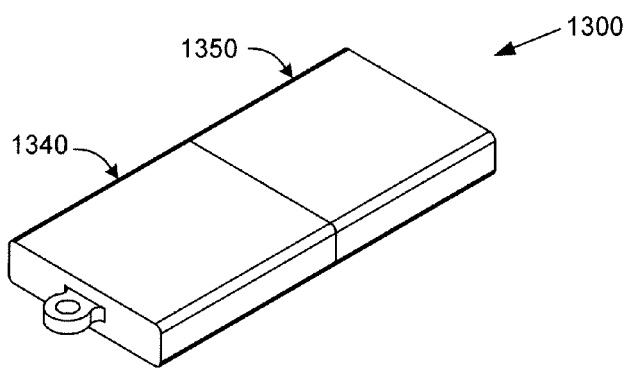

FIG. 28(A) is an exploded perspective view showing an USB assembly 1300 according to another alternative embodiment of the present invention, which includes a pre-molded plastic bottom piece carrier (case) 1310, an adhesive layer 1330, a rear cap 1340 and an optional front cap 1350 that collectively receive and secure modular USB core component 100. Bottom piece carrier 1310 has a bottom wall 1311, opposing side walls 1313 and 1314, and opposing end walls 1315 and 1316 that collectively define a trough 1312. Rear cap 1340 includes a lower wall 1341, an opposing upper wall 1342, opposing side walls 1343 and 1344, and a rear wall 1345 that form a box-like structure having an open end 1346 (which is facing away from rear cap 1340 in FIG. 28(A)). Front cap 1350 includes a lower wall 1351, an opposing upper wall 1352, opposing side walls 1353 and 1354, and a rear wall 1346 that form a box-like structure having an open end 1355. During assembly, double-sided adhesive tape layer 1330 is first placed inside trough 1312 and secured to bottom wall 1311, then modular USB core component 100 is mounted onto the upper surface of tape layer 1330. Rear cap 1340 is then slid over the partial assembly such that lower wall 1341 is disposed under a portion of lower wall 1311, and upper wall 1342 covers a rear portion of the upper surface of modular USB core component 100 (i.e., such that a front portion including metal contacts 120 is exposed). Front cap 1350 is then optionally removably slid over the front portion of modular USB core component 100 to protect metal contacts 120 during transportation, as indicated in FIG. 28(B). Necessary markings are placed on the both the body (i.e., bottom piece carrier 1310 and/or USB core component 100) and/or one or both caps 1340 and 1350 to complete the whole package assembly cycle.

Figure 29A:
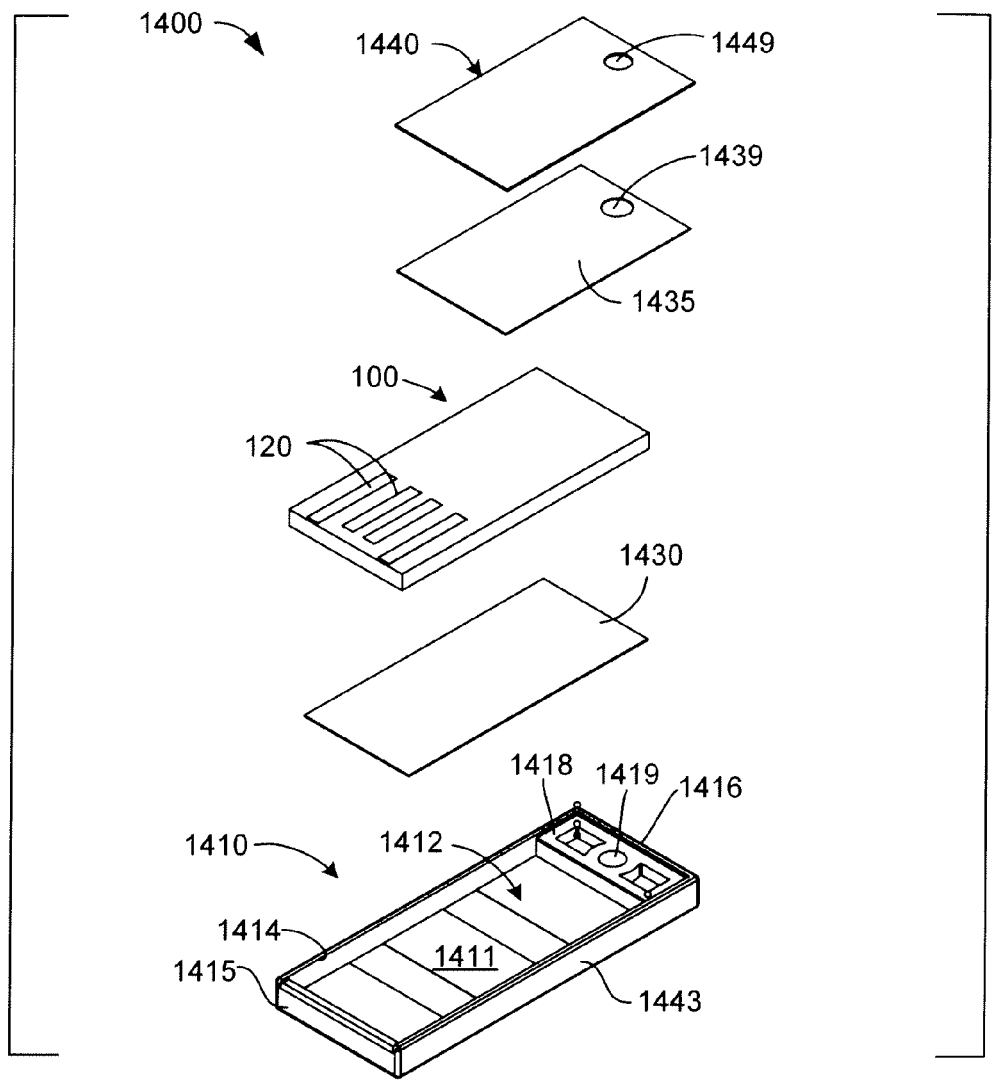
FIGS. 29(A) and 29(B) are exploded perspective and front assembled perspective views showing a USB assembly according to another embodiment of the present invention.
Figure 29B:
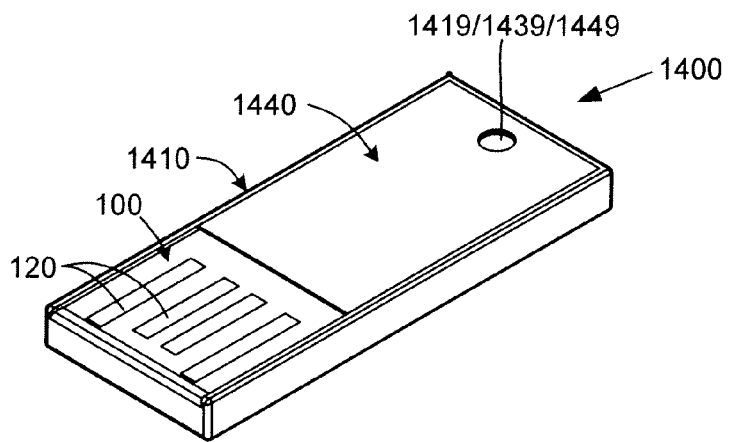

FIG. 29(A) is an exploded perspective view showing an USB assembly 1400 according to another alternative embodiment of the present invention, which includes a bottom piece carrier (case) 1410, a lower adhesive layer 1430, an upper adhesive layer 1435 and a cover plate 1440 that collectively receive and secure modular USB core component 100. Bottom piece carrier 1410 and cover plate 1440 are made of die casted Zinc (Zn), Aluminum (Al) or other metals, and is finished with chromium (Cr) plating to provide a bright and shinning appearance. Bottom piece carrier 1410 has a bottom wall 1411, opposing side walls 1413 and 1414, and opposing end walls 1415 and 1416 that collectively define a trough 1412. A flange 1418 is disposed adjacent to end wall 1416 that defines a through hole 1419, which is aligned with a corresponding opening 1439 in upper adhesive layer 1435 and an opening 1449 in cover plate 1440 to allow a small chain or string to loop through to form a key chain holder, or is merely used for hanging ornaments with decorative string. During assembly, double-sided lower adhesive tape layer 1430 is first placed inside trough 1412 and secured to bottom wall 1411, then modular USB core component 100 is mounted onto the upper surface of tape layer 1430 such that the opposite ends of modular USB core component 100 barely touch end walls 1415 and 1416. Upper adhesive layer 1435 is then mounted on a rear portion of the upper surface of modular USB core component 100. As indicated in FIG. 29(B), through-hole 1449 of metal plate 1440 is aligned with through-hole 1439 of adhesive tape 1435, which in turn are aligned with through-hole 1419 of bottom piece carrier 1410 to allow the key chain to thread through with precision and quality. The final USB memory product is shown in FIG. 29(B).

Figure 30A:
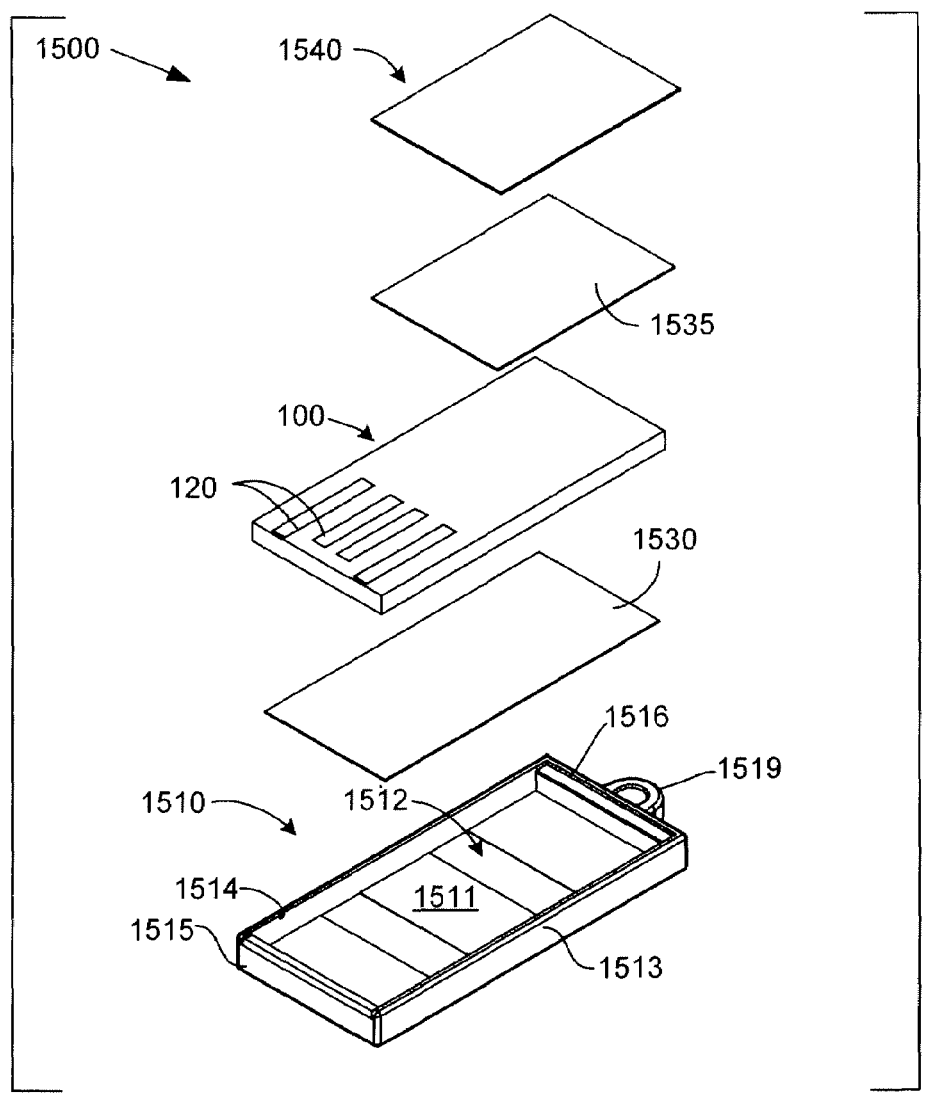
FIGS. 30(A) and 30(B) are exploded perspective and front assembled perspective views showing a USB assembly according to another embodiment of the present invention.
Figure 30B:
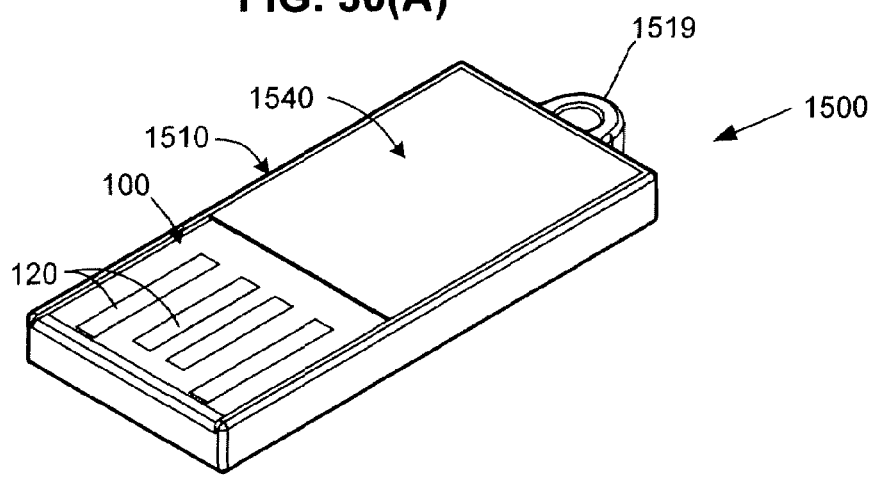

FIG. 30(A) is an exploded perspective view showing an USB assembly 1500 according to another alternative embodiment of the present invention, which includes a bottom piece carrier (case) 1510, a lower adhesive layer 1530, an upper adhesive layer 1535 and a cover plate 1540 that collectively receive and secure modular USB core component 100. Bottom piece carrier 1510 and cover plate 1540 are made of die casted Zinc (Zn), Aluminum (Al) or other metals, and is finished with chromium (Cr) plating to provide a bright and shinning appearance. Bottom piece carrier 1510 has a bottom wall 1511, opposing side walls 1513 and 1514, and opposing end walls 1515 and 1516 that collectively define a trough 1512. A donut hole structure 1519 extends from end wall 1516 and defines a through hole to allow a small chain or string to loop through to form a key chain holder. During assembly, double-sided lower adhesive tape layer 1530 is first placed inside trough 1512 and secured to bottom wall 1511, then modular USB core component 100 is mounted onto the upper surface of tape layer 1530 such that the opposite ends of modular USB core component 100 barely touch end walls 1515 and 1516. Upper adhesive layer 1535 is then mounted on a rear portion of the upper surface of modular USB core component 100. The final USB memory product is shown in FIG. 30(B).

Figure 31A:
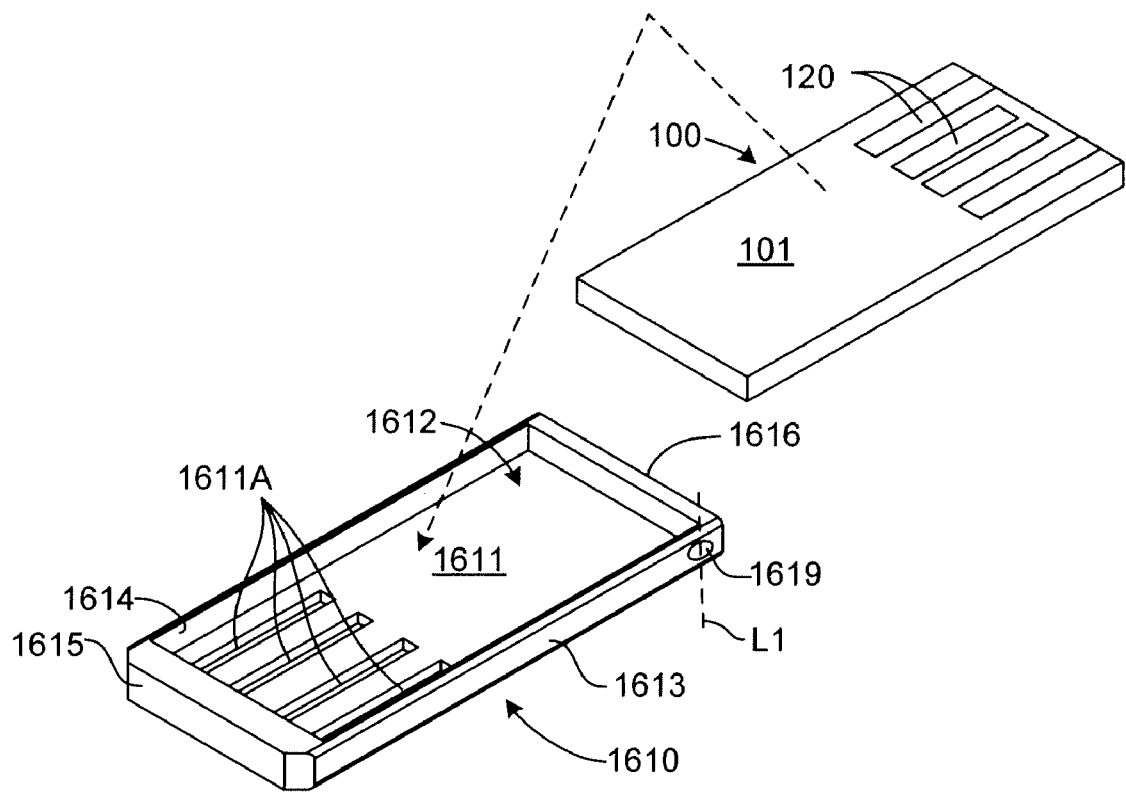
FIGS. 31(A) and 31(B) are exploded perspective and bottom assembled perspective views showing a partial USB assembly according to another embodiment of the present invention.
Figure 31B:
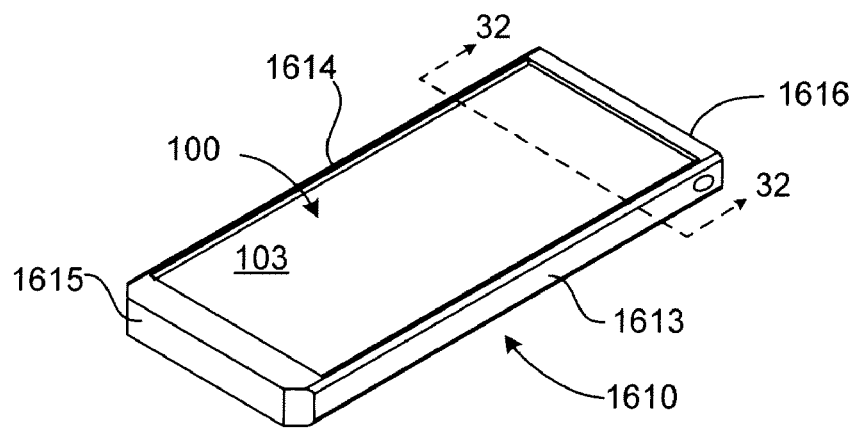

FIG. 31(A) is an exploded perspective view showing a portion of an USB assembly according to yet another embodiment of the present invention that utilizes a second step over-molding process to complete the manufacturing process. As indicated in FIG. 31(A), modular USB core component 100 is mounted onto a pre-molded plastic cover 1610 such that an upper surface 101 (i.e., the surface including metal contacts 120) faces downward against an upper wall 1611 of cover 1610. Cover 1610 also includes opposing side walls 1613 and 1614, and opposing end walls 1615 and 1616 that cooperate with upper wall 1611 to collectively define a trough 1612. Upper wall 1611 defines parallel elongated openings 1611A that are separated by ribs in the manner described above, and positioned such that each metal contact 120 is exposed through a corresponding opening 1611A when modular USB core component 100 is mounted in trough 1612. A small through-hole 1619 is formed at a 45 degree angle relative to side wall 1613 and end wall 1616 (i.e., in the direction of the small dashed line L1) to allow a small chain or string to loop through to form a key chain holder, or merely uses for hanging ornaments with decorative string.

Figure 32A:
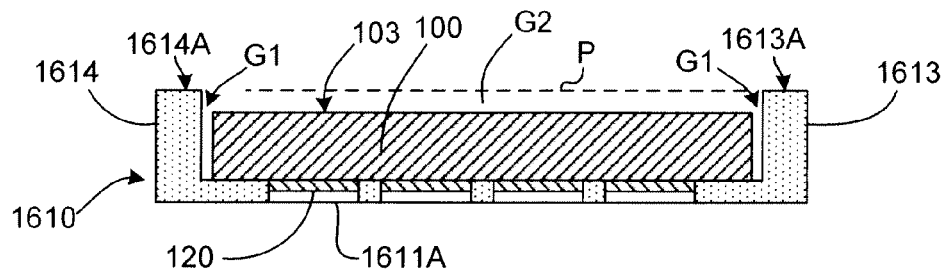
FIGS. 32(A), 32(B) and 32(C) are cross-sectional views showing an over-molding process for generating a completed USB assembly utilizing the partial USB assembly of FIG. 31(B)

FIG. 32(A) is a cross-sectional view taken along section line 32-32 of FIG. 31(A), and shows the partially formed assembly including modular USB core component 100 and cover 1610 in simplified form. As shown in both FIGS. 31(B) and 32(A), a lower surface 103 (i.e., the surface of modular USB core component 100 opposite to the metal contacts) faces upward (away) from cover 1610. Note that cover 1610 is sized such that small gaps G1 (shown in FIG. 32(A)) are provided between the peripheral edges 104 of modular USB core component 100 and walls 1613, 1614, 1615 and 1616 of cover 1610. Note also that, as shown in FIG. 32(A), lower surface 102 of modular USB core component 100 is disposed below a plane P defined by the lower edges of the peripheral walls (e.g., lower edges 1613A and 1614A of side walls 1613 and 1614), thereby forming a small gap G2 between plane P and lower surface 103.

Figure 32B:
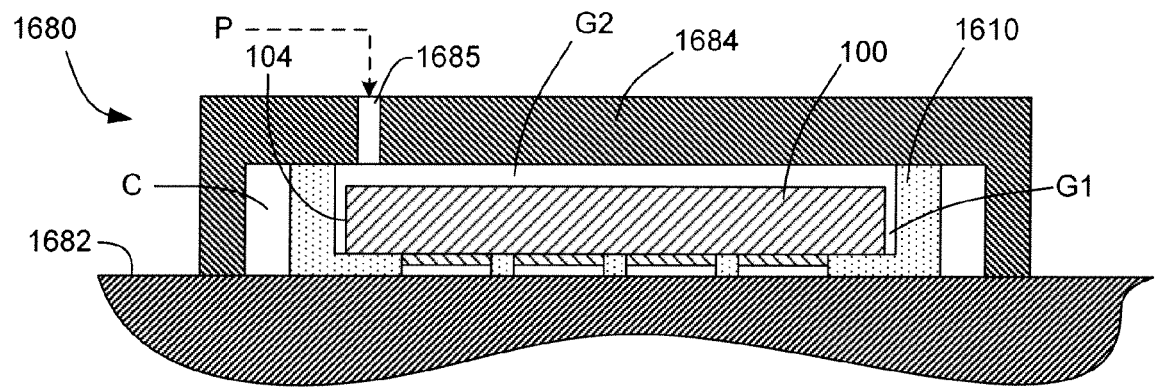

FIG. 32(B) is a simplified cross-sectional view depicting the partially formed assembly including modular USB core component 100 and cover 1610 disposed inside an over-molding (e.g., plastic injection molding) apparatus 1680. Apparatus 1680 includes a base portion 1682 and a die 1684 that collectively form a cavity C for receiving the partial assembly. During the over-molding process, molten plastic P is injected into cavity C through a nozzle (inlet port) 1685 such that the molten plastic flows over lower surface 103 and peripheral surfaces 104 of modular USB core component 100 and into gaps G1 and G2.

Figure 32C:
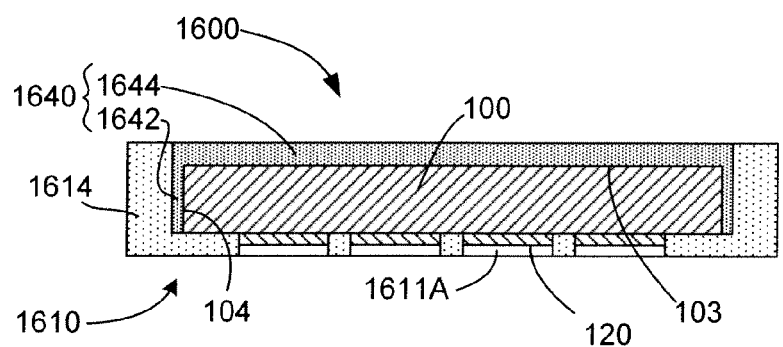
Figure 33A:
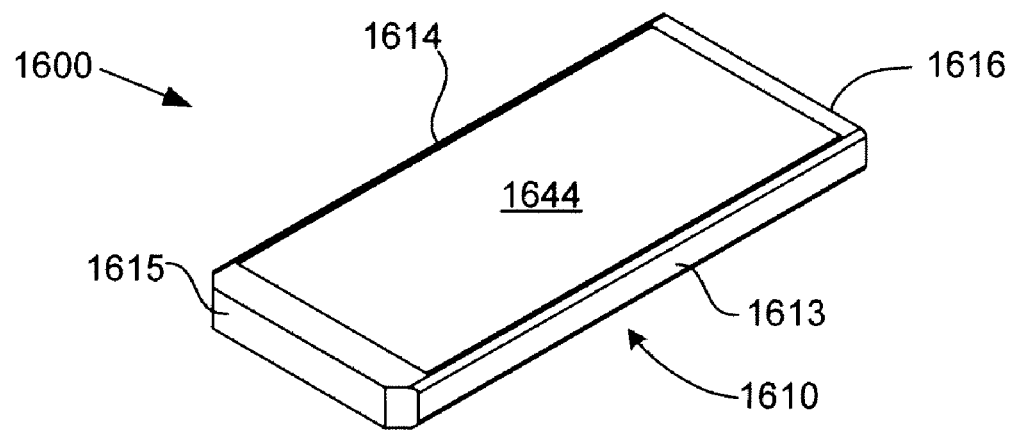
FIGS. 33(A) and 33(B) are top and bottom perspective views showing the completed USB assembly of FIG. 32(B)
Figure 33B:
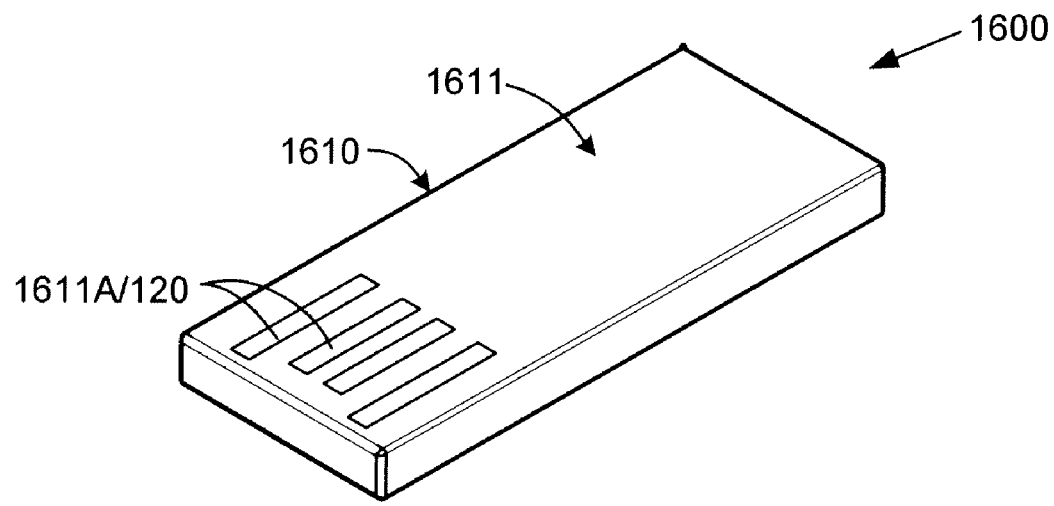

FIGS. 32(C), 33(A) and 33(B) are cross-sectional and perspective views showing the completed USB assembly 1600 after the over-molding process is completed. The over-molding process depicted in FIG. 32(B) forms an over-molded structure 1640 on the modular USB core component 100 such that peripheral portions 1642 of over-molded structure 1640 are disposed on peripheral edges 104 of the modular USB core component 100 (i.e., disposed between peripheral edges 104 of modular USB core component 100 and peripheral side walls 1613, 1614, 1615 and 1616 of cover 1610), and a lower wall portion 1644 of over-molded structure 1640 is disposed on lower surface 103 of modular USB core component 100, wherein metal contacts 120 of modular USB core component 120 face away from over-molded structure 1640 and are exposed through openings 1611A formed in lower wall 1611 of pre-molded plastic cover 1610.

Figure 34A:
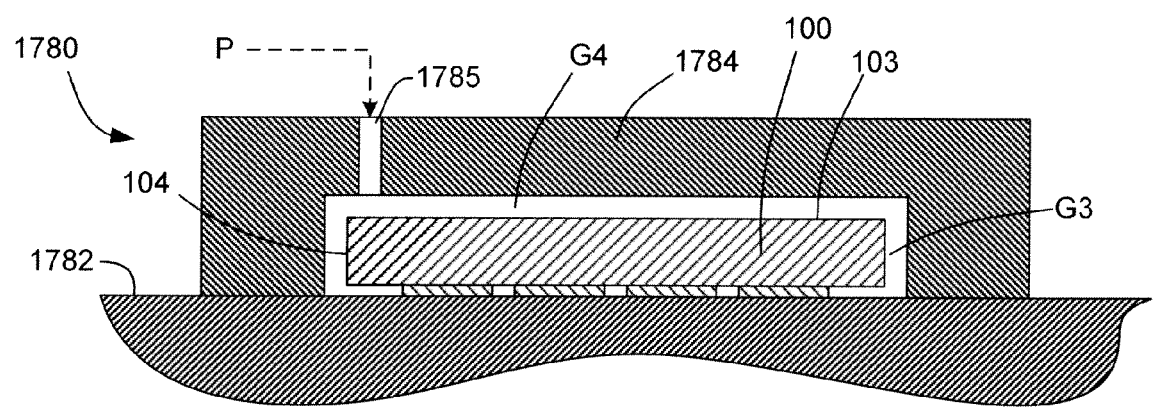
FIGS. 34(A) and 34(B) are cross-sectional views showing an over-molding process for generating a completed USB assembly according to another embodiment of the present invention.
Figure 34B:
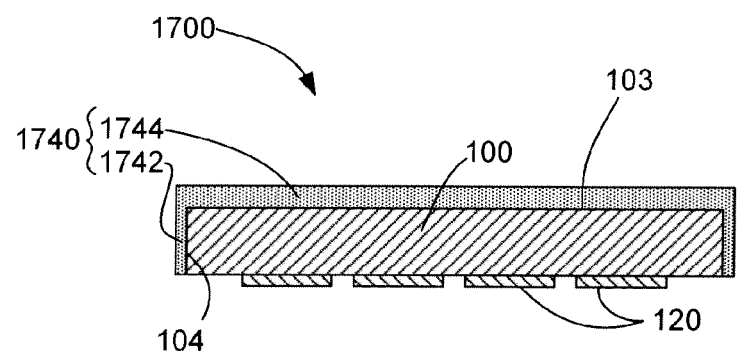

FIGS. 34(A) and 34(B) are simplified cross-sectional views showing the production of a USB assembly 1700 according to yet another embodiment of the present invention. The assembly process used in this embodiment is similar to the over-molding process embodiment described directly above, but does not employ the pre-molded plastic housing. In particular, as shown in FIG. 34(A), modular USB core component 100 is mounted inside an over-molding (e.g., plastic injection molding) apparatus 1780 such that metal contacts 120 abut base 1782. Apparatus 1780 includes a base portion 1782 and a die 1784 that collectively form a cavity formed such that gaps G3 and G4 are respectively formed between the peripheral surfaces 104 and lower surface 103 of USB core component 100 and facing walls of die 1784. During the over-molding process, molten plastic P is injected into the cavity through a nozzle (inlet port) 1785 such that the molten plastic flows over lower surface 103 and peripheral surfaces 104 of modular USB core component 100 to fill gaps G3 and G3. After the over-molding process is completed, the completed assembly 1700 (see FIG. 34(B)) includes an over-molded structure 1740 formed on the modular USB core component 100 such that peripheral portions 1742 of over-molded structure 1640 are disposed on peripheral edges 104 of the modular USB core component 100, and a lower wall portion 1744 of over-molded structure 1740 is disposed on lower surface 103 of modular USB core component 100, wherein metal contacts 120 of modular USB core component 120 face away from over-molded structure 1740. An optional through-hole (not shown) is also molded to connect two facet of over mold side walls at 45 degree angle in a manner similar to that described above, and this hole allows a small chain or string to loop through to form a key chain holder, or merely uses for hanging ornaments with decorative string.

Figure 35:
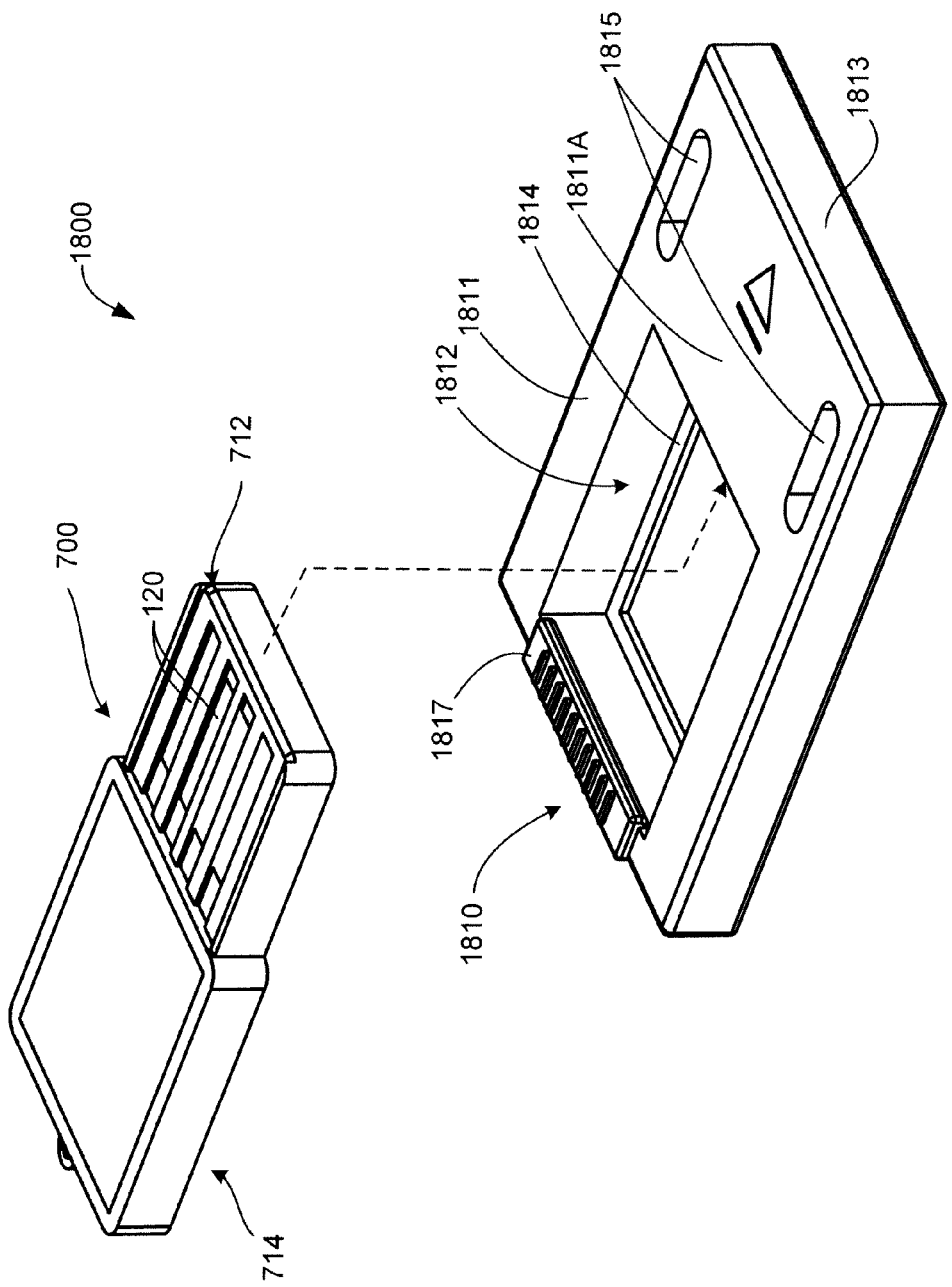
FIG. 35 is an exploded perspective view showing an USB assembly including a carrying case.

FIG. 35 illustrates an assembly 1800 according to another embodiment of the present invention in which any of the above-described USB assemblies (e.g., USB assembly 700) further includes a carrying case 1810. Carrying case 1810 includes a rectangular block shape body having a thickness slightly thicker than USB assembly 700. An upper wall 1811 of carrying case 1810 defines a large through-hole 1812 that is larger than assembly 700 to facilitate insertion thereof, and includes a cover portion 1811 and a front wall 1813 that form a cavity (not shown) for receiving front end portion 1712 of USB assembly 700. A lower sill (flange) 1814 is disposed around a lower end of through-hole 1812, and serves as a resting place (stopper) for USB assembly 700 after insertion. Carrying case 1810 includes two oval shaped through-holes 1815 designed to receive a chain or string to form a key chain holder, or merely uses for hanging ornaments with decorative string. A thin elevated plate 1817 is formed on a back edge of opening 1812 and has a plurality of ribs to improve the frictional property and the sense of touch for finger grip. USB assembly 700 is inserted in the direction indicated by the dashed-line arrow in FIG. 35 with metal contacts 120 tilted at an angle sloping relative to carrying case 1810, and front end portion 712 is then inserted into opening 712. Once front end 712 of memory card 700 has entered into carrying case 1810, the wider rear portion 1714 of USB assembly 700 is pressed down (i.e., rotated toward carrying case 1810) until the bottom surface of USB assembly 700 is firmly resting on sill 1814. To subsequently withdraw memory card 700 from carrying case 1810, the bottom side of memory card 700 is pushed via the bottom side of through-hole 1812 using a finger. Once the rear portion 714 of memory card 700 has been pushed (rotated) out from carrying case 1810, the rear portion 714 is grasped and pulled from carrying case 1810.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A USB assembly adapted to be accessed by a data terminal, said USB assembly comprising:
   a modular USB core component comprising:
   a PCBA including:
   a card body,
   a non-volatile memory device mounted on the card body,
   a card reader interface circuit mounted on said card body, and
   a processing unit mounted on said card body and connected to said non-volatile memory device and said card reader interface circuit,
   wherein said card body comprises a printed circuit board (PCB) having opposing first and second surfaces, a plurality of metal contacts disposed on the first surface, at least one passive component mounted on the second surface,
   wherein at least one of the non-volatile memory device, the card reader interface circuit and the processing unit comprises an unpackaged integrated circuit (IC) die mounted on the second surface of the PCB, and
   wherein a plurality of conductive traces are formed on the PCB such that each conductive trace is electrically connected to at least one of an associated metal contact, the IC die and the passive component; and
   a single-piece molded housing formed on the second surface of the PCBA such that said at least one passive component and said at least one IC die are covered by said molded housing, and such that substantially all of the first surface of the PCB is exposed; and
   a case fixedly connected to the modular USB core component such that the metal contacts are exposed through one or more openings defined by said case.

2. The USB assembly of claim 1, wherein the case comprises a single-piece, pre-molded plastic casing including a rear section and a front section, and wherein the modular USB core component is disposed in a cavity defined by the rear and front sections.

3. The USB assembly of claim 2, wherein the front section of the pre-molded plastic casing includes a plurality of ribs respectively separated by elongated openings, and wherein the modular USB core component is disposed in the cavity such that each of the plurality of metal contacts is exposed through a corresponding one of said plurality of elongated openings.

4. The USB assembly of claim 2, wherein the rear section of the pre-molded plastic casing defines an upper opening for insertion of the modular USB core component, and wherein the assembly further comprises a cover plate that is secured over the upper opening by one of a snap-coupling mechanism, a weld structure, an adhesive layer and a UV-cured epoxy adhesive.

5. The USB assembly of claim 1, wherein the case comprises a two-piece, pre-molded plastic casing including a lower case portion and an upper case portion mounted on the lower case portion, and wherein the modular USB core component is disposed in a cavity defined by the upper case portion and the lower case portion.

6. The USB assembly of claim 5, wherein the upper case portion includes a plurality of ribs respectively separated by elongated openings, and wherein the modular USB core component is disposed in the cavity such that each of the plurality of metal contacts is exposed through a corresponding one of said plurality of elongated openings.

7. The USB assembly of claim 5, wherein at least one of the upper case portion and the lower case portion are attached to the modular USB core component by way of an adhesive layer.

8. The USB assembly of claim 1, wherein the case comprises a bottom piece carrier defining a trough, and wherein the modular USB core component is disposed in the trough such that the metal contacts face away from the bottom piece carrier.

9. The USB assembly of claim 8, wherein the case further comprises one of a rear cap and a cover plate that is secured to the bottom piece carrier over a rear portion of the modular USB component.

10. The USB assembly of claim 1, wherein the case comprises an over-molded structure formed on the modular USB core component such that peripheral portions of the over-molded structure are disposed on the peripheral edges of the modular USB core component, and a lower wall portion of the over-molded structure is disposed on the lower surface of the modular USB core component, wherein the metal contacts of the modular USB core component face away from the over-molded structure.

11. The USB assembly of claim 10, wherein the case further comprises a pre-molded plastic cover having an upper wall and peripheral side walls defining a trough, wherein the upper wall defines a plurality of elongated openings, wherein the modular USB core component is mounted in trough such that each said metal contact is exposed through a corresponding one of said plurality of elongated openings, and wherein the peripheral portions of the over-molded structure are disposed between the peripheral edges of the modular USB core component and said peripheral side walls of the plastic cover.

12. The USB assembly of claim 1, further comprising a carrying case including a case body for securely holding the modular USB core component and the case such that the metal contacts are covered by a wall of the carrying case.

13. The USB assembly of claim 1, wherein the at least one integrated circuit (IC) die is electrically connected to the conductive traces by a plurality of wire bonds extending between said at least one IC die and corresponding contact pads disposed on the second surface of the PCB.

14. The USB assembly of claim 13, wherein the at least one passive component includes a lead that is soldered to a corresponding contact pad disposed on the second surface of the PCB.

15. The USB assembly of claim 14, wherein the at least one passive component comprises at least one of a resistor, a capacitor, an oscillator, and a light emitting diode.

16. The USB assembly of claim 13, wherein the at least one integrated circuit (IC) die includes a first IC die comprising an USB controller circuit, and a second IC die comprising a flash memory circuit.

17. The USB assembly of claim 16, wherein the at least one IC die comprises a plurality of flash memory dies disposed in a stacked arrangement such that a first flash memory die is mounted on the second surface of the PCB, and a second flash memory die is mounted on a surface of the first flash memory die.

18. The USB assembly of claim 17, wherein the first flash memory die is connected to said PCB by a first plurality of said wire bonds, and the second flash memory die is connected to one of the first flash memory die and said PCB by a second plurality of wire bonds.

19. The USB assembly of claim 13, wherein the at least one integrated circuit (IC) die includes a single-chip controller/flash die comprising controller circuit and one or more flash block mass storage circuits that are interconnected by a bus.

20. A method for producing an USB assembly comprising:
producing a modular USB core component including:
a PCBA including:
a cardbody,
a non-volatile memory device mounted on the card body,
a card reader interface circuit mounted on said card body, and
a processing unit mounted on said card body and connected to said non-volatile memory device and said card reader interface circuit,
wherein said card body comprises a printed circuit board (PCB) having opposing first and second surfaces, a plurality of metal contacts disposed on the first surface, at least one passive component mounted on the second surface,
wherein at least one of the non-volatile memory device, the card reader interface circuit and the processing unit comprises an unpackaged integrated circuit (IC) die mounted on the second surface of the PCB handle section, and
wherein a plurality of conductive traces are formed on the PCB such that each conductive trace is electrically connected to at least one of an associated metal contact, the IC die and the passive component; and
a single-piece molded housing formed on the second surface of the PCBA such that said at least one passive component and said at least one IC die are covered by said molded housing, and such that substantially all of the first surface of the PCB is exposed; and
mounting said modular USB core component into a case such that the case is fixedly connected to the modular USB core component with the metal contacts exposed through one or more openings defined by said case.

* * * * *